(12) United States Patent
Kasukabe et al.

(10) Patent No.: US 7,956,627 B2
(45) Date of Patent: Jun. 7, 2011

(54) PROBE CARD, SEMICONDUCTOR INSPECTING APPARATUS, AND MANUFACTURING METHOD OF SEMICONDUCTOR DEVICE

(75) Inventors: Susumu Kasukabe, Yokohama (JP); Naoki Okamoto, Nirasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 209 days.

(21) Appl. No.: 12/143,448

(22) Filed: Jun. 20, 2008

(65) Prior Publication Data

US 2009/0042323 A1  Feb. 12, 2009

(30) Foreign Application Priority Data

Aug. 7, 2007 (JP) ................... 2007-205953

(51) Int. Cl.
*G01R 31/00* (2006.01)
(52) U.S. Cl. .......... 324/750.22; 324/754.11; 324/756.03
(58) Field of Classification Search ............ None
See application file for complete search history.

(56) References Cited

U.S. PATENT DOCUMENTS

| | | | | |
|---|---|---|---|---|
| 4,906,920 A * | 3/1990 | Huff et al. | ............ | 324/750.22 |
| 5,339,027 A * | 8/1994 | Woith et al. | ............ | 324/754.13 |
| 5,412,866 A * | 5/1995 | Woith et al. | ............ | 29/848 |
| 5,422,574 A * | 6/1995 | Kister | ............ | 324/754 |
| 5,604,446 A * | 2/1997 | Sano | ............ | 324/754.16 |
| 5,642,056 A * | 6/1997 | Nakajima et al. | ............ | 324/758 |
| 5,672,977 A * | 9/1997 | Yamada | ............ | 324/754.14 |
| 5,804,983 A * | 9/1998 | Nakajima et al. | ............ | 324/758 |
| 5,825,192 A * | 10/1998 | Hagihara | ............ | 324/756.03 |
| 5,974,662 A * | 11/1999 | Eldridge et al. | ............ | 29/842 |
| 6,060,891 A * | 5/2000 | Hembree et al. | ............ | 324/755.04 |
| 6,952,110 B2 * | 10/2005 | Kohno et al. | ............ | 324/757 |
| 7,049,837 B2 * | 5/2006 | Kasukabe et al. | ............ | 324/754.07 |
| 7,420,380 B2 * | 9/2008 | Kasukabe et al. | ............ | 324/754 |
| 7,776,626 B2 | 8/2010 | Hasebe et al. | | |
| 2006/0192575 A1 | 8/2006 | Kasukabe et al. | | |
| 2007/0159192 A1 * | 7/2007 | Hasegawa et al. | ............ | 324/754 |

FOREIGN PATENT DOCUMENTS

| | | |
|---|---|---|
| CN | 1512186 A | 7/2004 |
| JP | 02-163664 | 6/1990 |
| JP | 2001-159643 A | 6/2001 |
| JP | 2005-024377 | 1/2005 |
| WO | 2006/097982 A1 | 9/2006 |

OTHER PUBLICATIONS

ITC (International Test Conference) of 1998, pp. 601-607.

* cited by examiner

*Primary Examiner* — Paresh Patel
(74) *Attorney, Agent, or Firm* — Mattingly & Malur, P.C.

(57) ABSTRACT

A frame bonded and fixed to a back face of a probe sheet so as to surround a group of pyramid-shaped or truncated pyramid-shaped contact terminals collectively formed at a central region portion of the probe sheet on a probing side thereof is protruded from a multi-layered wiring board, and pressing force is imparted to the frame and a pressing piece at a central portion by a plurality of guide pins having spring property so as to tilt finely.

18 Claims, 28 Drawing Sheets

PROBE CARD, SEMICONDUCTOR INSPECTING APPARATUS, AND MANUFACTURING METHOD OF SEMICONDUCTOR DEVICE

CROSS-REFERENCE TO RELATED APPLICATION

The present application claims priority from Japanese Patent Application No. JP 2007-205953 filed on Aug. 7, 2007, the content of which is hereby incorporated by reference into this application.

TECHNICAL FIELD OF THE INVENTION

The present invention relates to a probe card, a semiconductor inspecting apparatus, and a manufacturing method of a semiconductor device, and in particular to an effective technique applied to a probe sheet formed in a similar technique to that used in manufacture of a semiconductor device, a probe card using the probe sheet, a semiconductor inspecting apparatus including the probe card, and a manufacturing step of a semiconductor device including an inspecting step conducted by the semiconductor inspecting apparatus.

BACKGROUND OF THE INVENTION

One example of flow of an inspecting step of manufacturing steps of a semiconductor device performed after formation of semiconductor element circuits on a semiconductor wafer (hereinafter, simply called "wafer") is mainly shown in FIG. 26 exemplifying a package product, a bare chip and a CSP (Chip Size (Scale) package) as a typical shipment pattern of the semiconductor device.

In manufacturing steps of a semiconductor device, as shown in FIG. 26, the following three inspections are conducted roughly. The three inspections include wafer inspection which is first conducted in a wafer state where semiconductor element circuits and electrodes have been formed on a wafer in order to grasp a conductive state and an electric signal operation state of semiconductor elements, burn-in inspection which extracts an unstable semiconductor element in a high temperature state, in a high-voltage application state or the like, and sorting inspection which is performed to grasp product performance before shipping semiconductor devices.

Regarding an apparatus (semiconductor inspecting apparatus) used for such inspections of a semiconductor device, in the conventional art, a wafer is provided on a surface of the apparatus with many semiconductor devices (a semiconductor chip (hereinafter, simply called "chip") and it is cut to individual semiconductor devices for use. Individual cut semiconductor devices are each provided with many electrodes arranged on a surface thereof. In order to manufacture many semiconductor devices industrially and to inspect electric characteristic of the semiconductor devices, a connection device configured of a probe formed of tungsten needles protruded obliquely from a probe card is used. In inspection using the connection device, a method for rubbing an electrode by contact pressure utilizing flexure of the probe to take contact with the electrode and inspecting electric characteristics of a semiconductor device is used.

In recent years, according to density growth of a semiconductor element, narrow pitch and multi-pin configuration of probe for inspection advances in an inspection step at a time of manufacturing a semiconductor device. Therefore, for a step of transmitting an electric signal between the electrode of the semiconductor element and an inspecting circuit reliably to conduct an operation inspection, it is desired to develop an inspecting apparatus of an semiconductor element using a connection device which can achieve probing to fine electrodes of a semiconductor element with a narrow pitch and multi-pin configuration with high positional accuracy and can prevent damage owing to probing to the semiconductor element through a low load.

As an inspecting method and an inspecting apparatus which allow characteristic inspection of a semiconductor element applied when density growth and narrow pitch configuration of a semiconductor element advance, which requires an operation test using a high-speed signal, there is a technique described in collection of papers and lectures of ITC (International Test Conference) of 1988, pp 601-607 (Non-Patent Document 1). FIG. 27 is a schematic view of a structure of an inspecting apparatus disclosed in the Non-Patent Document 1, and FIG. 28 is an enlarged perspective view of a main portion of the inspecting apparatus. A probe for the inspecting apparatus used here uses hemispherical bumps 205 obtained by forming wires 202 on an upper face of a flexible insulating film 201 by photolithography technique, forming a ground layer 203 on a lower face of the insulating film 201, and plating through-holes 204 of the insulating film 201 provided at positions corresponding to electrodes of a semiconductor which is an object to be inspected as contact terminals. The technique is directed to an inspecting method for rubbing bumps 205 connected to an inspecting circuit (not shown) through a wire 202 formed on a surface of the insulting film 201 and a wiring substrate 206 to bring them in contact with electrodes of a semiconductor element which is an object to be inspected by resilient force of a leaf spring 207 and performing transmission and reception of a signal.

Japanese Patent Application Laid-open Publication No. 02-163664 (Patent Document 1) discloses an inspecting apparatus for a semiconductor element, and FIG. 29 is an illustrative view of a structure of a probe card for inspection of the inspecting apparatus. The probe card is a probe device which holds a pivot pin 208 attached with leaf springs 207 in a conical well 210 supported by a rotary plate 209 to push out an insulating film 201 formed with bumps 205 and wires.

Japanese Patent Application Laid-open Publication No. 2005-24377 (Patent Document 2) discloses an inspecting apparatus for a semiconductor device, and FIG. 30 is a schematic view showing a structure of a probe card for inspection of the inspecting apparatus. The probe card is a probe device which divides a probe sheet into four pieces and pushes out a four-sided pyramid-shaped contact terminal 212 and an insulating film 213 formed with wiring via a pushing piece 214 and cushioning material by a spring plunger 211 provided in the center of divided probe sheet pieces.

SUMMARY OF THE INVENTION

In recent years, it is desired to develop an inspecting apparatus for a semiconductor device using a connection device which can perform operation inspection by transmitting an electric signal between electrodes of a semiconductor device with a narrow pitch and multi-pin configuration and an inspecting circuit. A semiconductor device for a high-speed electric signal is manufactured by using material (for example, organic-base material) with dielectric constant smaller than that of silicon oxide ($SiO_2$) in order to achieve fine wiring while reducing dielectric loss. Since such material with small dielectric constant is relatively weak in withstand load and mechanical strength, an inspecting apparatus which can realize a stable contact resistance value at a low load of about several tens mN or less is desired so as not to damage the material with a low dielectric constant. In view of these circumstances, the above technique is examined.

Regarding material to be contacted producing oxide on a surface of material for an aluminum electrode, a solder electrode or the like, a probe comprising tungsten needles and a probe formed with the hemispherical bumps rubs contact terminals against electrodes to remove oxide on a surface of the electrode material in a rubbing manner and brings the contact terminals in contact with metal conductive material below the oxide to secure a contacting state. As a result, by rubbing an electrode by a contact terminal, shaving of electrode material occurs, which causes short-circuiting between wires and foreign matter occurrence. By rubbing a probe against an electrode with applying load of about several hundreds mN or more to secure a contacting state, material with lower dielectric constant may be damaged.

Thus, when a method of using a bump formed at a portion of a wire by plating the portion of wiring as a probe as shown in FIGS. 27 to 29 is adopted, since a distal end portion of the bump becomes flat or hemispherical, it is difficult to remove oxide from material to be contacted such as an aluminum electrode or a solder electrode producing oxide on its material surface in a rubbing manner, so that contact resistance becomes unstable, where load at a time of contacting or rubbing must be set to about several hundreds mN or more. However, excessive increase of load at a time of the contacting is problematic. That is, since electrodes with high density, multi-pin and narrow pitch configuration are formed on a surface of a semiconductor element due to advance of denser integration of the semiconductor device, many active devices or fine wires are frequently formed just below the electrodes, and when contact pressure of a probe to electrodes at a time of an inspection of the semiconductor element is excessively large, the electrode(s), or the active device(s) and the wire(s) just below the electrode(s) may be damaged, so that it is necessary to conduct operation control at a time of probing carefully, which may result in lowering of throughput of inspection.

Since it is anticipated that variations occur in shapes of bumps or the like, further large contacting load is required as a whole in order to achieve full contact of a protrusion (bump) put in insufficient contact, which results in such a problem that excessive contact pressure acts partially. Therefore, in addition to a shape of a contact terminal which can penetrate oxide or the like on a surface of material to be contacted to secure stable contact characteristic, a flexible probe sheet is required in order to achieve secure contact with an electrode to be contacted at a time of pressing of the probe sheet.

Since it is necessary to bring contact terminals for inspection in contact with fine electrode pads for inspection of a semiconductor element arranged at a narrow pitch with a high positional precision, and it is necessary to prevent occurrence of connection failure at a time of wire bonding using electrode pads or a time of forming bumps for connection at the subsequent steps, roughness of electrode pad faces caused by probing must be prevented as far as possible. Therefore, a probing trace is required to be made finer as far as possible.

In an inspecting apparatus which conducts probing perpendicularly to electrodes for inspection of a semiconductor element using the four-sided pyramid-shaped contact terminals shown in FIG. 30, a contact resistance value is stable, but when further narrow pitch configuration and higher speed electric signal are required in recent years, further improvement of a positional accuracy of a distal end of the contact terminal is required. In addition, material with low dielectric constant relatively weak in withstand load tends to be used as material for forming a circuit for high-speed transmission, and a further lower load probe is required in order to prevent damage to a semiconductor device at a time of probing.

An object of the present invention is to provide a probe card for semiconductor device inspection which allows probing inspection without damaging to an electrode pad to be contacted owing to low load and which has contact terminals with multi-point and high density configuration which can achieve contact with small probing trace and is excellent in transmission characteristic and stable in contact characteristic.

Another object of the present invention is to provide a probe card which can hold accuracy of a distal end of a contact terminal at a time of probing inspection in high level.

A still another object of the present invention is to provide a probe card for semiconductor device inspection using a probe sheet with reduced loss of high-speed transmission signal by realizing a high-speed transmission circuit with impedance matching.

Brief summary of representative ones of the inventions disclosed in the present application will be explained in the following manner.

(1) According to the present invention, there is provided a probe card including a probe sheet, the probe sheet comprising:

a plurality of contact terminals contacting with electrodes provided on an object to be inspected;

wires drawn from the contact terminals; and a plurality of peripheral electrodes electrically connected to the wires and electrodes of a multi-layered wiring board, wherein a frame formed so as to surround the plurality of contact terminals, and a plurality of means for imparting a pressing force to the frame are provided.

(2) The probe card according to the present invention as described in the above (1), there is provided means for allowing tilting of a region where the plurality of contact terminals are formed within a region where the frame is formed.

(3) According to the present invention, there is provided a probe card including a probe sheet, the probe sheet comprising:

a plurality of contact terminals contacting with electrodes provided on an object to be inspected;

wires drawn from each of the plurality of contact terminals; and a plurality of peripheral electrodes electrically connected to the wires and electrodes of a multi-layered wiring board, wherein a frame formed so as to surround the plurality of contact terminals, and means for allowing tilting of a region where the plurality of contact terminals are formed within a region where the frame are provided.

(4) According to the present invention, there is provided a probe card including a probe sheet, the probe sheet comprising:

a plurality of contact terminals contacting with electrodes provided on an object to be inspected;

wires drawn from each of the plurality of contact terminals; and a plurality of peripheral electrodes electrically connected to the wires and electrodes of a multi-layered wiring board, wherein the plurality of contact terminals are pyramid-shaped or truncated pyramid-shaped, a pressing plate for contacting with the peripheral electrodes of the probe sheet in a pressurizing manner, a frame formed so as to surround the plurality of contact terminals, and a plurality of means for imparting a pressing force to the frame are provided, and the probe sheet is held so as to protrude from the multi-layered wiring board.

(5) According to another aspect of the present invention, there is provided a probe card according to the present invention comprising:

a multi-layered wiring board which is electrically connected to a tester for inspecting electric characteristics of an object to be inspected;

a probe sheet which includes a plurality of peripheral electrodes connected to electrodes of the multi-layered wiring board and a plurality of contact terminals contacting with electrodes provided on the object to be inspected;

a frame which is formed so as to surround the plurality of contact terminals; and a plurality of means which applies pressing force to the frame, wherein the plurality of contact terminals is each formed in a pyramid-shape or a truncated pyramid-shape, and the plurality of means applying the pressing force is arranged such that a region where the frame is formed and a region where the plurality of contact terminals is formed can move in a tilting manner.

(6) The probe card according to the present invention as described in any one of the above (1)-(5), wherein the probe sheet has at least one of a ground wiring layer and a power source wiring layer electrically connected to the wires, and the wires connected to the ground wiring layer and the power source wiring layer are formed to have a width larger than that of a wire which is not connected to either of the ground wiring layer and the power source wiring layer.

(7) The probe card according to the present invention as described in any one of the above (1)-(6), wherein means for imparting a pressing force at a central portion of the probe sheet is provided.

(8) The probe card according to the present invention as described in any one of the above (1)-(6), wherein the plurality of means for imparting the pressing force to the frame include a plurality of guide pins having spring property.

(9) The probe card according to the present invention as described in any one of the above (1)-(6), wherein the plurality of means for imparting the pressing force to the frame include a plurality of guide pins having spring property and a plurality of guide pins without spring property.

(10) The probe card according to the present invention as described in any one of the above (1)-(6), wherein the plurality of contact terminals are formed by plating utilizing holes formed by etching a substrate having crystalline in an anisotropic manner as mold material.

(11) According to the present invention, there is provided a semiconductor inspecting apparatus comprising:

a sample stand on which an object to be inspected is mounted; and a probe card which has a plurality of contact terminals contacting with electrodes provided on the object to be inspected and is electrically connected to a tester inspecting electric characteristics of the object to be inspected, wherein the probe card including a probe sheet, the probe sheet comprising:

the plurality of contact terminals contacting with electrodes provided on the object to be inspected;

wires drawn from each of the contact terminals; and a plurality of peripheral electrodes electrically connected to the wires and electrodes of a multi-layered wiring board, and a frame formed so as to surround the plurality of contact terminals, a plurality of means for imparting a pressing force to the frame, and means for allowing tilting of a region where the plurality of contact terminals are formed within a region where the frame is formed are provided.

(12) According to the present invention, there is provided a semiconductor inspecting apparatus comprising:

a sample stand on which an object to be inspected is mounted; and a probe card which has a plurality of contact terminals contacting with electrodes provided on the object to be inspected and is electrically connected to a tester inspecting electric characteristics of the object to be inspected, wherein the probe card including a probe sheet, the probe sheet comprising:

the plurality of contact terminals contacting with electrodes provided on the object to be inspected;

wires drawn from each of the contact terminals; and a plurality of peripheral electrodes electrically connected to the wires and electrodes of a multi-layered wiring board, and the plurality of contact terminals are pyramid-shaped or truncated pyramid-shaped, and a pressing plate for contacting with the plurality of peripheral electrodes of the probe sheet in a pressurizing manner, a frame formed so as to surround the plurality of contact terminals, and a plurality of means for imparting a pressing force to the frame, and the probe sheet is held so as to protrude from the multi-layered wiring board.

(13) According to the present invention, there is provided a semiconductor inspecting apparatus comprising:

a sample stand on which an object to be inspected is mounted; and a probe card which has a plurality of contact terminals contacting with electrodes provided on the object to be inspected and is electrically connected to a tester inspecting electric characteristics of the object to be inspected, wherein the probe card including:

a multi-layered wiring board connected to the tester inspecting electric characteristics of the object to be inspected, a probe sheet having a plurality of peripheral electrodes connected to the multi-layered wiring board, and a plurality of contact terminals contacting with electrodes provided on the object to be inspected, a frame formed so as to surround the plurality of contact terminals, and a plurality of means for imparting a pressing force to the frame, and the plurality of contact terminals are pyramid-shaped or truncated pyramid-shaped, and the plurality of means for imparting the pressing force is disposed such that the region where the frame is formed and the region where the plurality of contact terminals are formed can be tilted.

(14) According to the present invention, there is provided a manufacturing method of a semiconductor device comprising:

a step of producing circuits and electrodes electrically connected to the circuits in a semiconductor wafer and forming a plurality of semiconductor elements;

a step of inspecting electric characteristics of the plurality of semiconductor elements using a probe card having a plurality of contact terminals contacting with the electrodes provided on the plurality of semiconductor elements, and being electrically connected to a tester for inspecting electric characteristics of the circuits formed on each of the plurality of semiconductor elements; and a step of dicing the semiconductor wafer to separate the same to the plurality of semiconductor elements, wherein the probe card includes a probe sheet, the probe sheet comprising:

the plurality of contact terminals contacting with electrodes provided on the plurality of semiconductor elements;

wires drawn from each of the plurality of contact terminals; and a plurality of peripheral electrodes electrically connected to the wires and electrodes of a multi-layered wiring board;

the plurality of contact terminals are pyramid-shaped and truncated pyramid-shaped;

a frame formed so as to surround the plurality of contact terminals, and a plurality of means for imparting a pressing force to the frame are provided;

the plurality of means for imparting the pressing force to the frame is disposed such that the region where the frame is formed and the region where the plurality of contact terminals are formed can be tilted; and while the pressing force is imparted to the region where plurality of the contact terminals of the probe sheet held so as to protrude from the multi-layered wiring board via the frame are formed via the frame, the plurality of contact terminals are brought in contact with the electrodes provided on the plurality of semiconductor elements so that the electric characteristics of the circuits are inspected.

(15) According to the present invention, there is provided a manufacturing method of a semiconductor device according to the above (14), wherein the plurality of contact terminals are formed by plating utilizing holes formed by etching a substrate having crystalline in an anisotropic manner as mold material.

The above and other objects and novel characteristics of the present invention will be apparent from the description of this specification and the accompanying drawings.

BRIEF DESCRIPTIONS OF THE DRAWINGS

DESCRIPTIONS OF THE PREFERRED EMBODIMENTS

Figure 1:
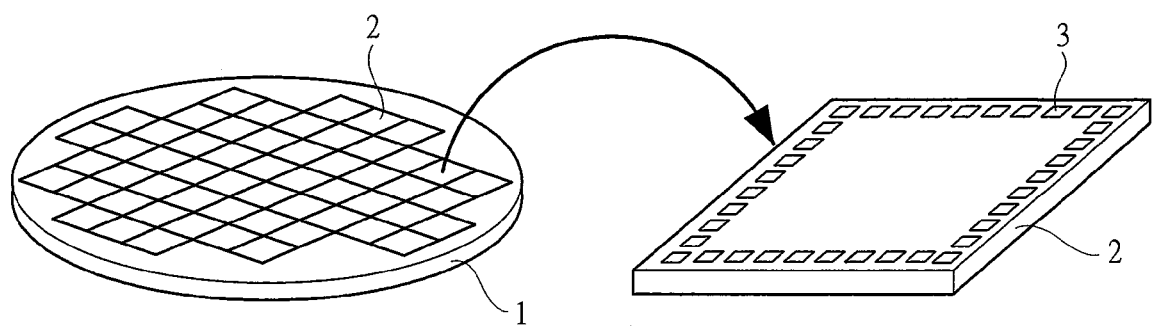
FIG. 1 is a perspective view showing a wafer to be contacted on which semiconductor elements (chips) have been arranged and a semiconductor element (a chip) which is a portion thereof.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Also, in the embodiments etc., when it is mentioned "comprising A", "including A" relating to components etc., except the case where there is mentioned clearly and especially that only the component is included, it is needless to say that the other components are excluded.

Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. The same goes for the numerical value and the range described above.

Also, components having the same function are denoted by the same reference symbols throughout the drawings for describing the embodiments, and the repetitive description thereof is omitted.

Further, when referring to the material etc., except that it is mentioned especially not so, or it is not so in principle or in condition, the designated material is main material and does not exclude secondary element, additions, additive element etc. For example, silicon members include not only pure silicon, but also additive impurities, and alloys of second or third dimensions etc. (for example, SiGe) which have silicon as a main element except the case in which it is mentioned especially.

Also, in some drawings used in the embodiments, hatching is used even in a plan view so as to make the drawings easy to see.

Main terms in following embodiments and examples are defined in the following manner.

The "semiconductor device" may be a product in a wafer state on which a circuit has been formed, a semiconductor element, a product (QFP (Quad Flat Package) which has been packaged thereafter, a BGA (Ball Grid Array), a CSP (Chip Size Package) and the like regardless of a shape thereof.

The "probe sheet" may be a thin film provided with a contact terminals contacting with an object to be inspected and wires extended from them, the wires being formed with electrodes for external connection, and it has a thickness of about 10 μm to 100 μm.

The "probe card" is a structure (for example, a structure explained with reference to FIG. 2 in an embodiment described later) having terminals contacting with an object to be inspected, a multi-layered wiring board, and the like.

The "semiconductor inspecting apparatus" is an inspecting apparatus having a sample supporting system on which a probe card and an object to be inspected are placed.

Many semiconductor devices (chips) for an LSI which is each one example of an object to be inspected are formed on a wafer 1 and they are thereafter used as individual separated pieces, as shown in FIG. 1. FIG. 1 is a perspective view showing a wafer 1 on which many semiconductor elements 2 for LSI are arranged, and it also shows one semiconductor element 2 which is one portion of the wafer in an enlarged manner. Many electrodes 3 electrically connected to a circuit formed within a semiconductor element 2 along a periphery of the semiconductor element 2 are arranged on a surface of the semiconductor element 2.

Now, the semiconductor element 2 is put in a situation where high densification and narrow pitch of arrangement of the electrodes 3 further progress according to dense integration. Tendency of narrow pitch of arrangement of electrodes 3 reaches about 0.1 mm or less, and further progresses, for example, 0.08 mm, 0.04 mm, or less. The high densification of electrodes 3 tends to transition from one row arrangement to two row arrangement, further a whole face arrangement along a periphery of the semiconductor element 2.

There is such a tendency that a high temperature operation test (85° C. to 1500° C.) for grasping characteristics and reliability of a semiconductor element more clearly is performed by conducting operation test of the semiconductor element at a high temperature.

Semiconductor inspecting apparatuses according to the following examples or embodiments can respond to high densification and narrow pitch of the electrodes 3 and allow inspection utilizing high-speed electric signals (100 MHz to 20 GHz).

By using material having heat resistance of 150° C. and a linear expansion coefficient approximately equal to that of an object to be inspected as constituent material for a portion of a probe card in a semiconductor inspecting apparatus, it is made possible to prevent positional deviation of a probe distal end portion due to an atmospheric temperature.

A probe card for semiconductor device inspection according to the present embodiment will be explained below with reference to FIGS. 2 to 19.

First Embodiment

Figure 2:
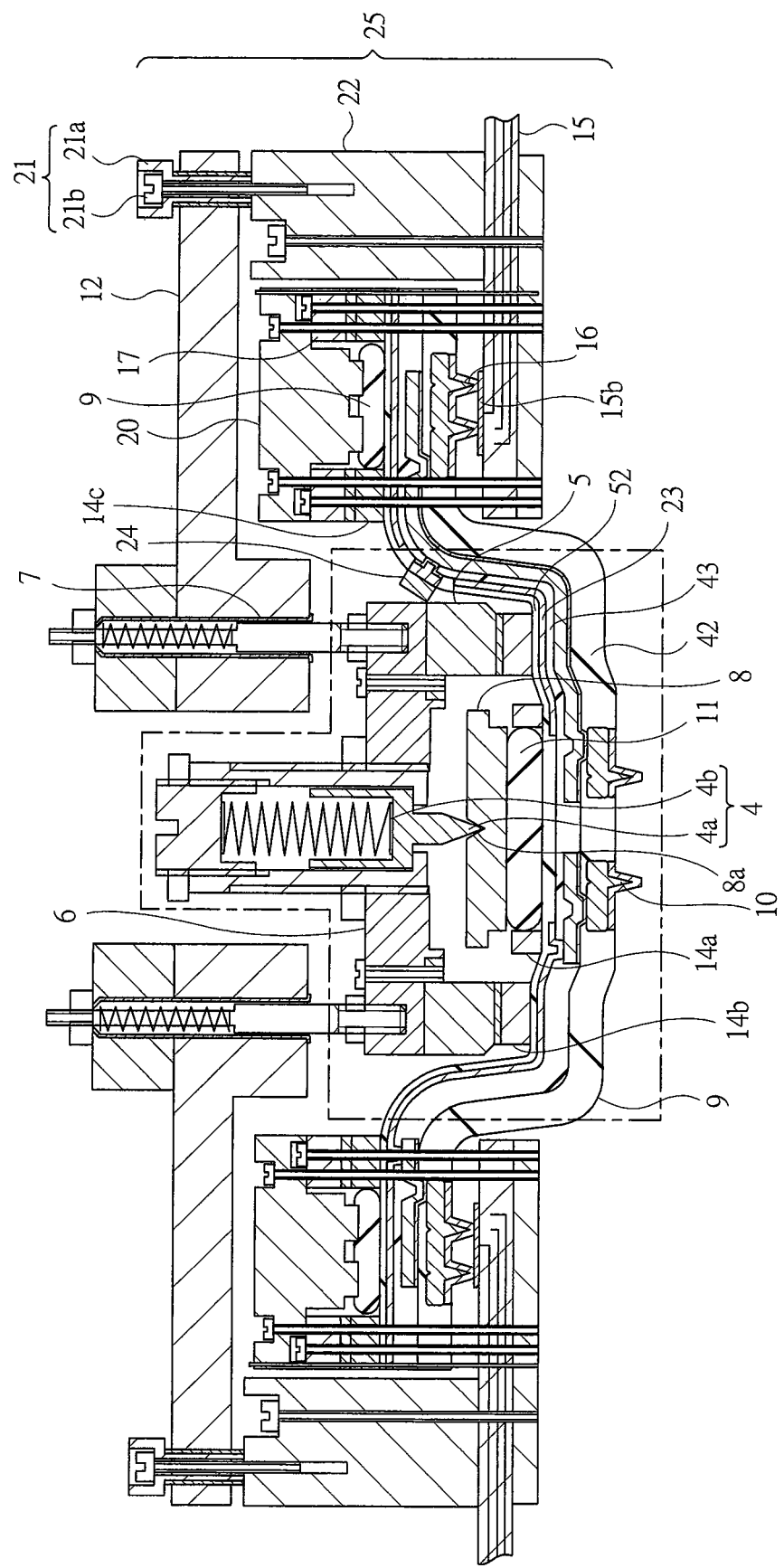
FIG. 2 is a cross sectional view of a main portion of a probe card according to a first embodiment of the present invention.
Figure 3:
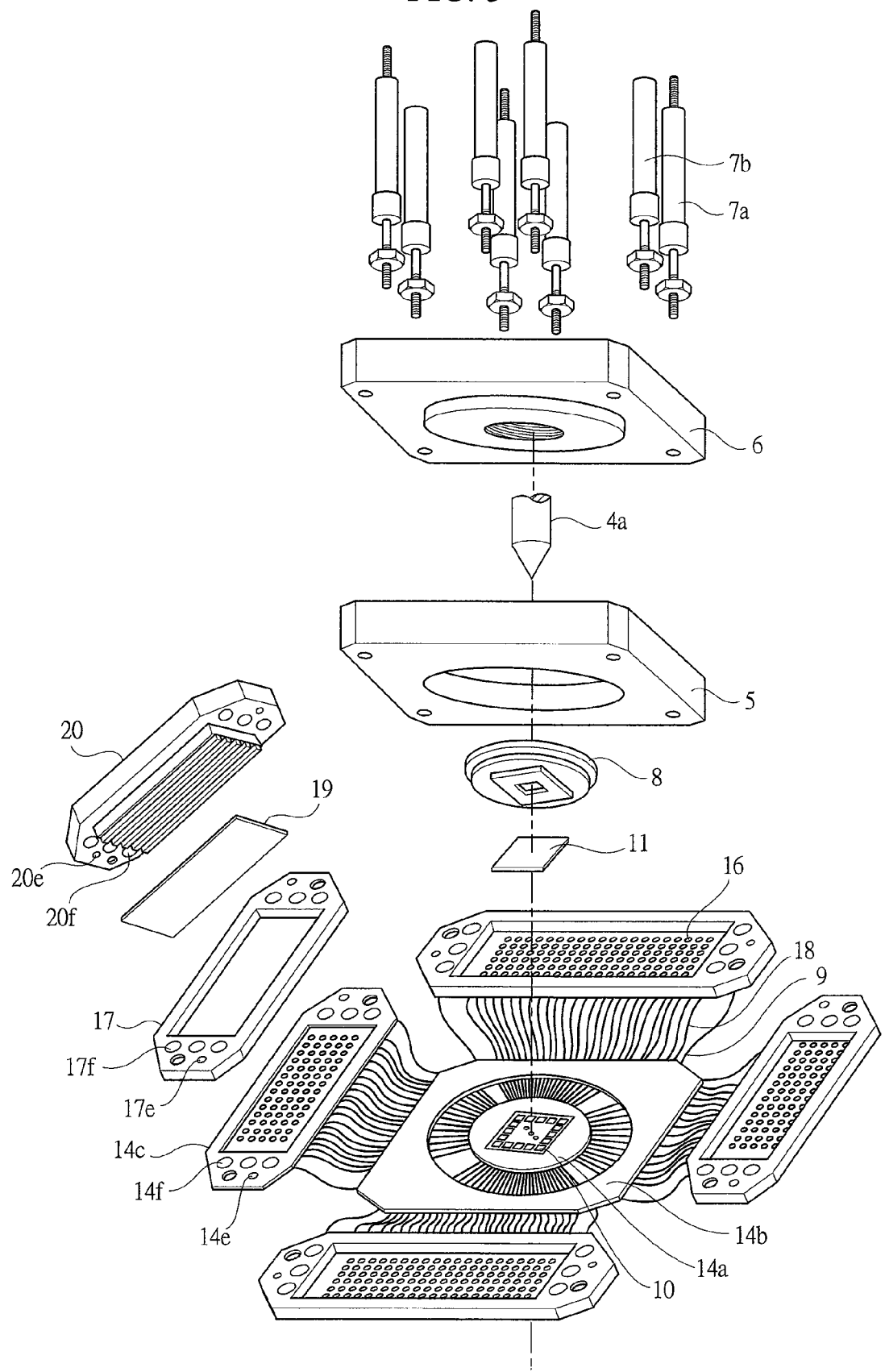
FIG. 3 is a perspective view showing main parts of the probe card shown in FIG. 2 in an exploded manner.
Figure 4:
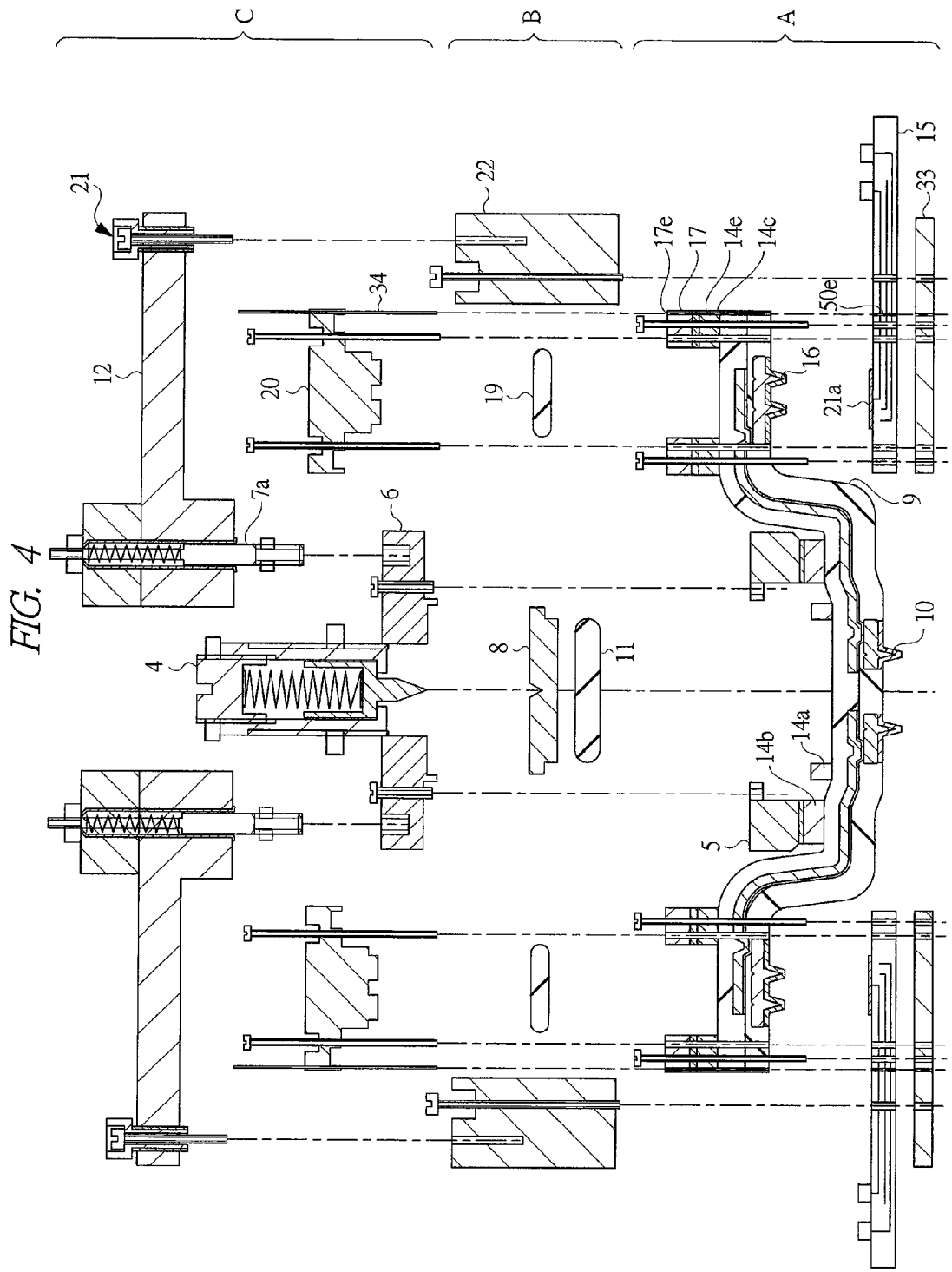
FIG. 4 is a cross sectional view showing assembling of main parts of the probe card shown in FIG. 2 in an exploded manner.

FIG. 2 is a cross sectional view showing a main portion of a probe card according to a first embodiment, FIG. 3 is a perspective view showing main parts shown in FIG. 2 in an exploded manner, and FIG. 4 a sectional view showing assembling of main parts of the probe card shown in FIG. 2 in an exploded manner. A probe card according to the first embodiment will be explained with reference to FIGS. 2 to 5.

The probe card according to the first embodiment includes a spring plunger 4, a frame 5, an intermediate plate 6, a plurality of guide pins 7, and the like.

The spring plunger (means for imparting a pressing force to a probe sheet center) 4 is fixed to a central portion of the intermediate plate 6 such that it is adjustable in its height direction, it has a protrusion portion 4a at its lower end to serve as a center pivot, and it is provided with a spring 4b imparting pressing force to a probe sheet 9 via a pushing piece 8 movable about a distal end of the protrusion portion 4a serving as a fulcrum.

The frame 5 is bonded and fixed to a back face of the probe sheet 9 so as to surround a region where contact terminals 10 of the probe sheet 9 has been formed.

The intermediate plate 6 includes a cushioning material 11 such as a silicon sheet and the pushing piece 8 at a central portion thereof between the intermediate plate 6 and the back face of the probe sheet 9 where the contact terminals 10 group has been formed to be screwed to the frame 5.

Figure 5:
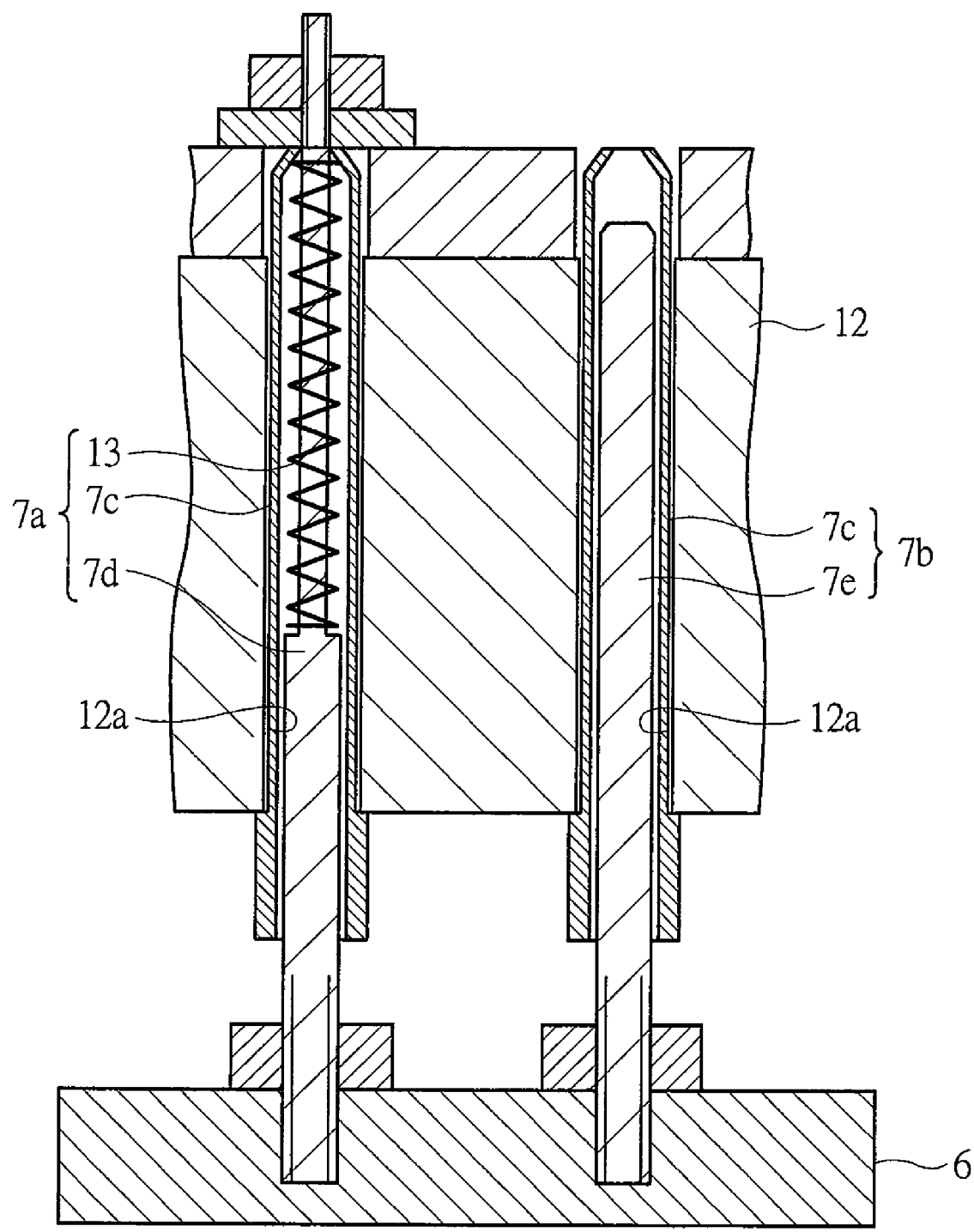
FIG. 5 is a cross sectional view of a main portion showing guide pins which are a main part of the probe card shown in FIG. 2.

The guide pins 7 are inserted into a supporting member (an upper fixing plate) 12 to be screwed to the intermediate plate 6. The guide pins 7 are configured such that spring-incorporated guide pins 7a having a spring 13 built-in and positioning-dedicated guide pins 7b as shown in FIG. 5 are used in order to prevent positional deviation of contact terminal distal ends at a time of probing inspection as much as possible and realize a desired approximately constant pressing force (for example, in case of about 500 pins, about 5 to 10N in a pushing-in amount of about 150 μm) in a movable (finely tiltable) state in a state that a region where the contact terminals 10 have been formed. The plurality of spring-incorporated guide pins (a plurality of means for imparting pressing force to the frame) 7a and the plurality of positioning-dedicated guide pins 7b are inserted into the supporting member 7 to be screwed and fixed to the intermediate plate 6 for use. Each spring-incorporated guide pin 7a has such a structure that the spring 13 and an inner shaft 7d are incorporated in a tube 7c made of metal and the intermediate plate 6 is pressed through the inner shaft 7d by biasing force of the spring 13, while each positioning-dedicated guide spring 7b has such a structure that an inner shaft 7e is incorporated in a tube 7c made of metal and the inner shaft 7e is fixed to intermediate plate 6 to conduct positioning. At least three guide pins 7 are disposed, and four or more guide pins 7 are preferably disposed. An insertion hole 12a of the supporting plate 12 into which the guide pin 7 is inserted is preferably set such that a clearance (play) between the same and the guide pin 7 after inserted is small as much as possible in order to prevent positional deviation of the contact terminal distal end. In the first embodiment, a diameter of the insertion hole 12a may be set to be larger than a diameter of the guide pin 7 by about 10 μm to 20 μm.

The pushing piece 8 is a compliance mechanism with such a structure that it is held by a protrusion 4a at a distal end of the spring plunger 4 provided at the center portion of the intermediate plate 6 to be finely tiled and it imparts a desired approximately constant pressing force (performs pressing) by the spring plunger 4. Incidentally, a conical groove 8a engaged with the protrusion portion 4a is formed at an upper central portion of the pushing piece 8.

Incidentally, though described in detail later, the spring plunger 4 may have such a structure that the spring 4b is removed and the spring plunger 4 is used in a finely tiltable state using the protrusion portion 4a as a fulcrum (see FIG. 10).

The probe sheet 9 is formed with the contact terminal 10 group for contacting with an electrode 3 group of the semiconductor element 2 at a central region portion on the probing (main face) side of the sheet and it is formed with a metal film 14a and a metal film 14b on a region corresponding to the frame 5 so as to surround the contact terminal 10 group doubly. A peripheral electrode 16 group having a structure similar to that of the contact terminal 10 group is formed on peripheral portions of four sides of the probe sheet 9 in order to perform signal transmission and reception with a multi-layered wiring board 15, and a metal film 14c is formed on a region corresponding to a peripheral electrode fixing plate 17 so as to surround the peripheral electrode 16 group. Incidentally, the peripheral electrode 16 group has a structure similar to that of the contact terminal 10 group, and a distal end thereof is connected to an electrode 15b of the multi-layered wiring board 15. Many leading wires 18 shown in FIG. 3 are formed between the contact terminal 10 group and the peripheral electrode 16 group. Though described in detail later, individual contact terminals forming the contact terminal 10 group and the peripheral electrode 16 group are each formed in a pyramid-shape or a truncated pyramid-shape.

Further, the frame 5 is bonded and fixed to the back face of the probe sheet 9 corresponding to the region where the contact terminal 10 group has been formed, and the peripheral electrode fixing plate 17 is bonded and fixed to the back face of the probe sheet 9 corresponding to the portion where the peripheral electrode 16 group for performing signal transmission and reception has been formed.

Further, the frame 5 is screwed to the intermediate plate 6 screwed with the plurality of guide pins 7. Such a configuration is adopted that the spring plunger 4 is fixed to the intermediate plate 6 and the protrusion portion 4a at a lower distal end of the spring plunger 4 is engaged with the conical groove 8a formed at the upper face central portion of the pushing piece 8.

Knock pin holes 14e for positioning and screw-insertion holes 14f are pattern-formed on the metal film 14c by etching, and knock pin holes 17e and 20e for positioning and screw-insertion holes 17f and 20f are also formed on the peripheral electrode fixing plate 17 and a peripheral retaining plate 20, respectively, so that assembling easiness can be improved.

A peripheral electrode 16 group is connected to electrodes 15b of the multi-layered wiring board 15 via a buffering material 19 by screwing a peripheral retaining plate 20 to the peripheral electrode fixing plate 17 fixed to the probe sheet 9 via the buffering material 19 so as to surround the peripheral electrode 16 group.

Figure 6:
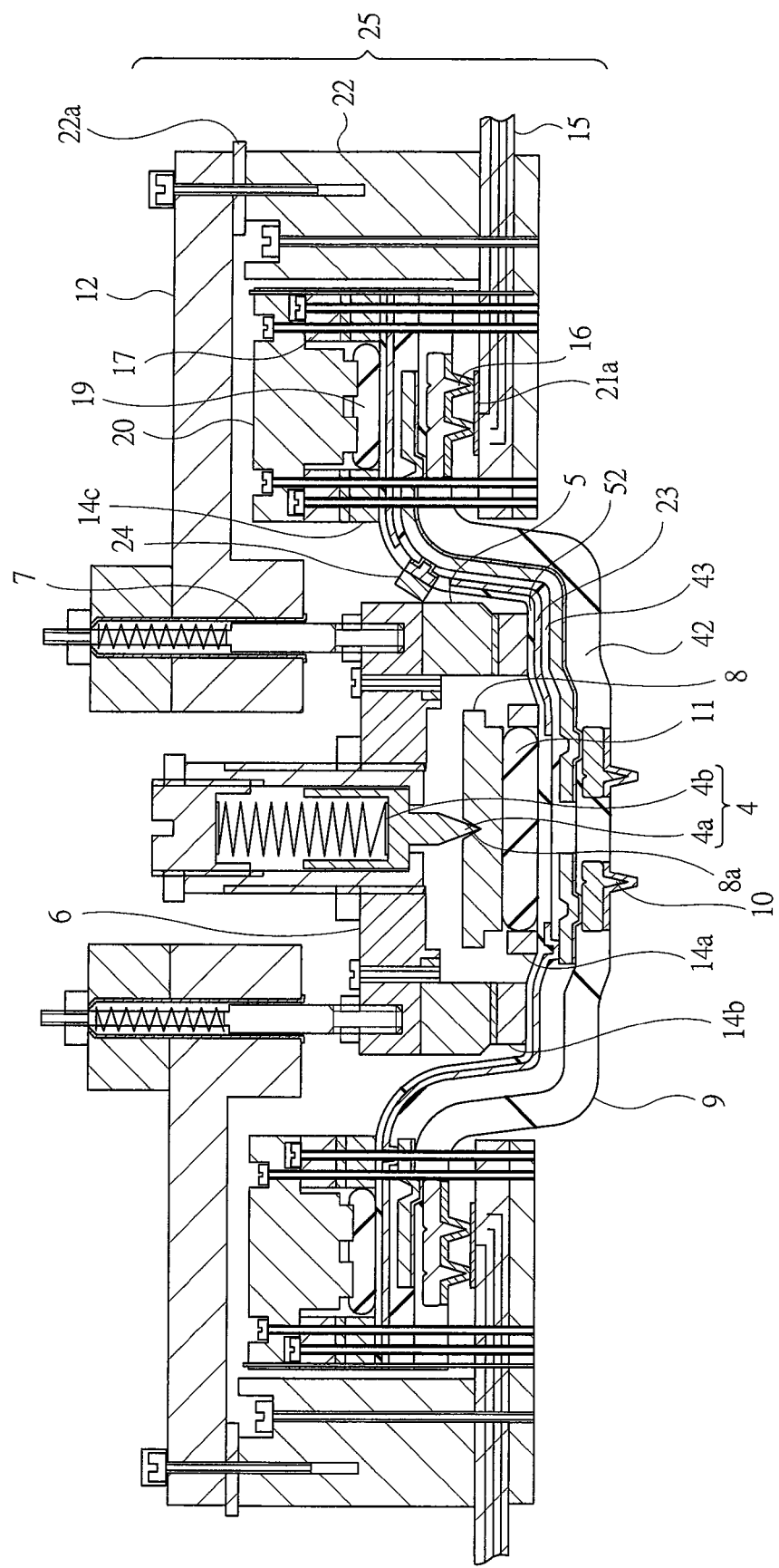
FIG. 6 is a sectional view of a main portion of the probe card according to the first embodiment of the present invention.

Incidentally, inclination of the probe sheet 9 on the region where the contact terminal 10 group has been formed may be finely adjusted using a double screw 21 for fine adjustment of inclination provided on the supporting member 12 or a spacer 22a (see FIG. 6). Here, the double screw 21 has a structure that another inner screw 21b is formed at a center of an outer screw 21a, and after inclinations of the supporting member 12 and an upper plate 22 are finely adjusted by adjusting a distance between the both using the outer screw 21a, fixation is conducted in a screw manner using the inner screw 21b.

A ground wire 23 for electrical connection to a reference potential (ground potential) is formed in the probe sheet 9. By providing such a ground wire 23 in the probe sheet 9, disturbance of a signal waveform transmitted at a time of probing inspection can be prevented.

A chip capacitor 24 is attached on the back face of the probe sheet 9. The chip capacitor 24 is electrically connected to a predetermined contact terminal of the contact terminal 10 group via a wire formed in the probe sheet 9. Arrangement of such a chip capacitor 24 is effective when it is desired to prevent disturbance of a signal as much as possible by arranging the chip capacitor 24 near the contact terminal 10.

The probe sheet structure 25 according to the first embodiment is formed using various members such as described above.

According to the first embodiment such as described above, by adopting such a configuration that pressing force is provided or imparted simultaneously with positioning of the probe sheet 9 conducted by the plurality of guide pins 7 (the spring-incorporated guide pins 7a with spring property and the positioning-dedicated guide pins 7b), a probe card for a semiconductor inspection with narrow pitch and multi-pin configuration where pressing force has been controlled over a wide range can be realized. According to progress of high integration within a semiconductor element 2, since electrodes 3 are formed on a surface of the semiconductor element 2 so as to have a densified multi-pin and narrow pitch configuration, many active devices or fine wires are frequently formed just below the electrodes 3, so that, when contact pressure of the contact terminal 10 group to the electrodes 3 group at a time of an inspection of the semiconductor element 2 is excessively large, electrodes 3 and active elements or wires just below the electrodes may be damaged. In the probe card for semiconductor inspection according to the first embodiment, however, pressing load can be controlled over a wide range, so that such active elements or wires can be prevented from being damaged.

Now, it is anticipated that a face of the electrode 3 group on a surface of the semiconductor element 2 and a face of the electrode terminal 10 group are put in an inclined state. Therefore, according to the first embodiment, the spring plunger 4, the frame 5, the intermediate plate 6, the guide pins 7, the pushing piece 8, the probe sheet 9, the cushioning material 11, and the metal films 14a and 14b within the region surrounded by a dashed-dotted line in FIG. 2 can conduct pressing action in such a situation that the region where the contact terminal 10 group has been formed can be finely tilted. Thereby, since further large contact load for completely bringing contact the terminals and electrodes 3 which are in an insufficient contact state into contact with each other is made unnecessary, so that the contact terminal 10 group and the electrode 3 group to be contacted can be brought in secure contact with each other while contact pressure between the contact terminal 10 group and the electrode 3 group is prevented from partially increasing excessively. As a result, since the surface of the electrode (s) 3 due to probing can be prevented from being roughened as much as possible, stable contact characteristics, namely, a stable contact resistance value can be secured even in a lower load.

Second Embodiment

Figure 7:
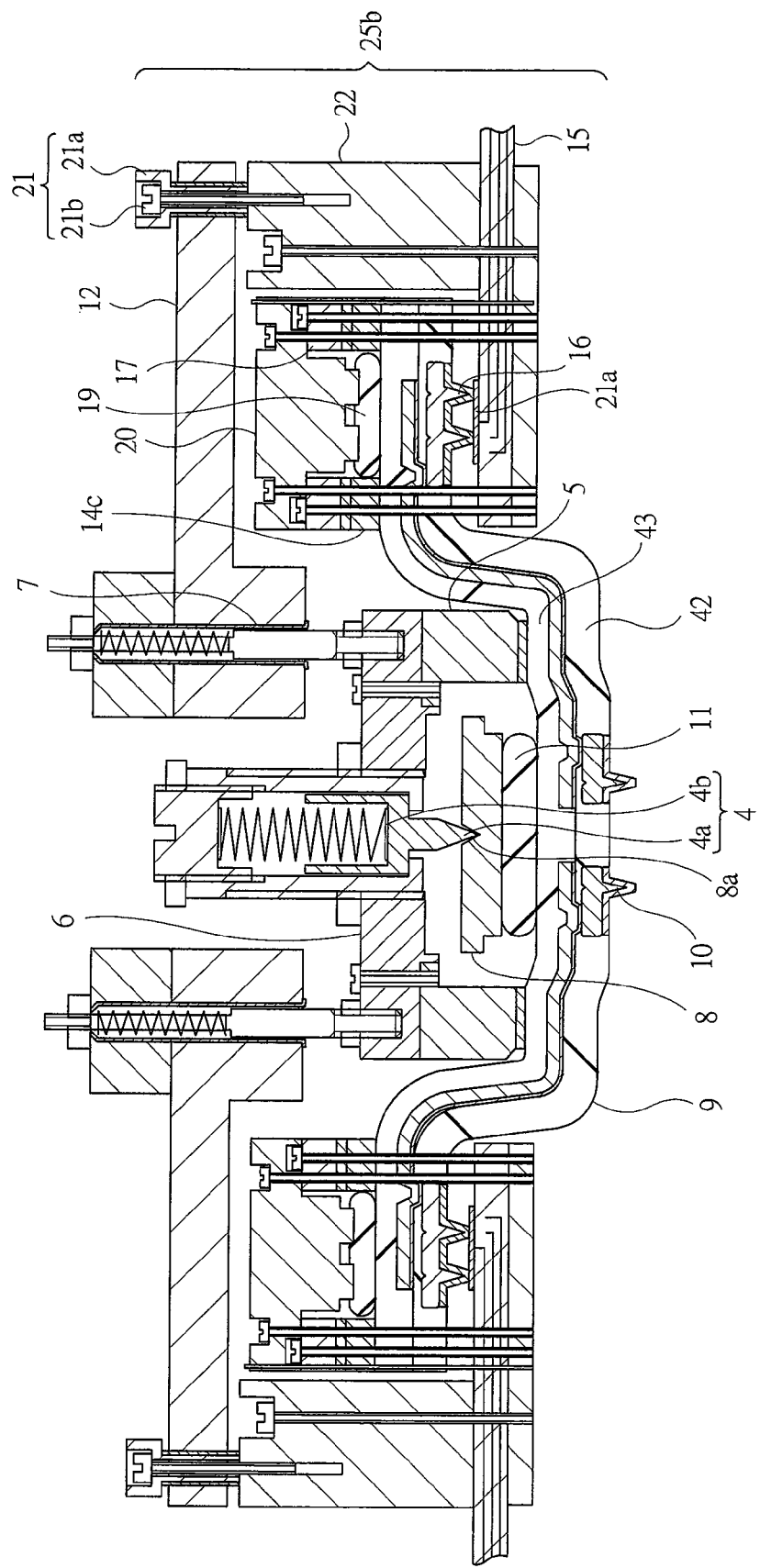
FIG. 7 is a sectional view of a main portion of the probe card according to the second embodiment of the present invention.

FIG. 7 is a cross sectional view showing a main portion of a probe card according to a second embodiment. In the first embodiment, the case that the ground wire 23 is formed on the probe sheet 9 and the chip capacitor 24 is attached thereon has been shown (see FIG. 2 and FIG. 6), but when a high-speed electric inspection signal is not required, as shown in FIG. 7, such a configuration that the ground wire 23, the chip capacitor 24, or the both may be omitted may be adopted.

In a configuration of a probe card explained below, such a configuration can be adopted depending on a speed of an inspection signal that the ground wire 23 or the chip capacitor 24 has been omitted like the above. The double screw 21 for fine adjustment of inclination (see FIG. 2) or the spacer 22a (see FIG. 6) can be used according to needs and it may be omitted, of course.

In FIG. 2 shown in the first embodiment, the example where the metal film 14a and the metal film 14b on a region corresponding to the frame 5 have been formed so as to surround the periphery of the contact terminal 10 group doubly has been shown, but one or both of the metal film 14a and the metal film 14b may be omitted according to distal end portion accuracy of a required contact terminal, as shown in FIG. 7.

Among the wires (wire material) formed in the probe sheet 9, the ground wire 23 electrically connected to the reference potential (ground potential) and the wire electrically connected to the power source may be each formed to have a wire width larger than those of the other wires which are neither connected to the reference potential (ground potential) nor the power source as much as possible. Thereby, the ground wire 23 and the wires electrically connected to power source are each reduced in wire resistance value to prevent voltage fluctuation at a time of inspecting the probing as much as possible.

By adopting a probe sheet structure 25b according to the second embodiment with such a structure, effects similar to those of the first embodiment can be obtained.

Third Embodiment

Figure 8:
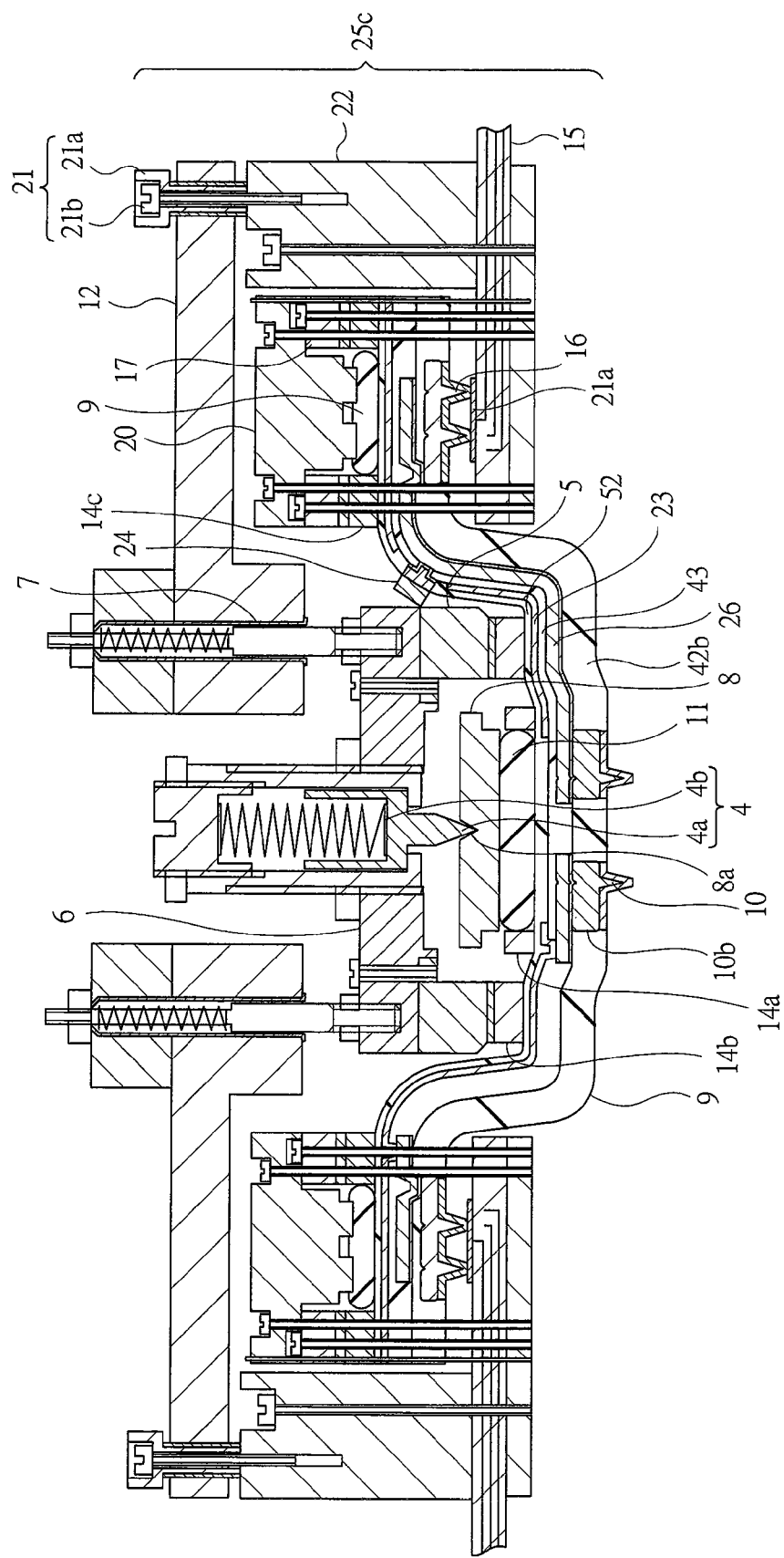
FIG. 8 is a sectional view of a main portion of the probe card according to the third embodiment of the present invention.
Figure 9:
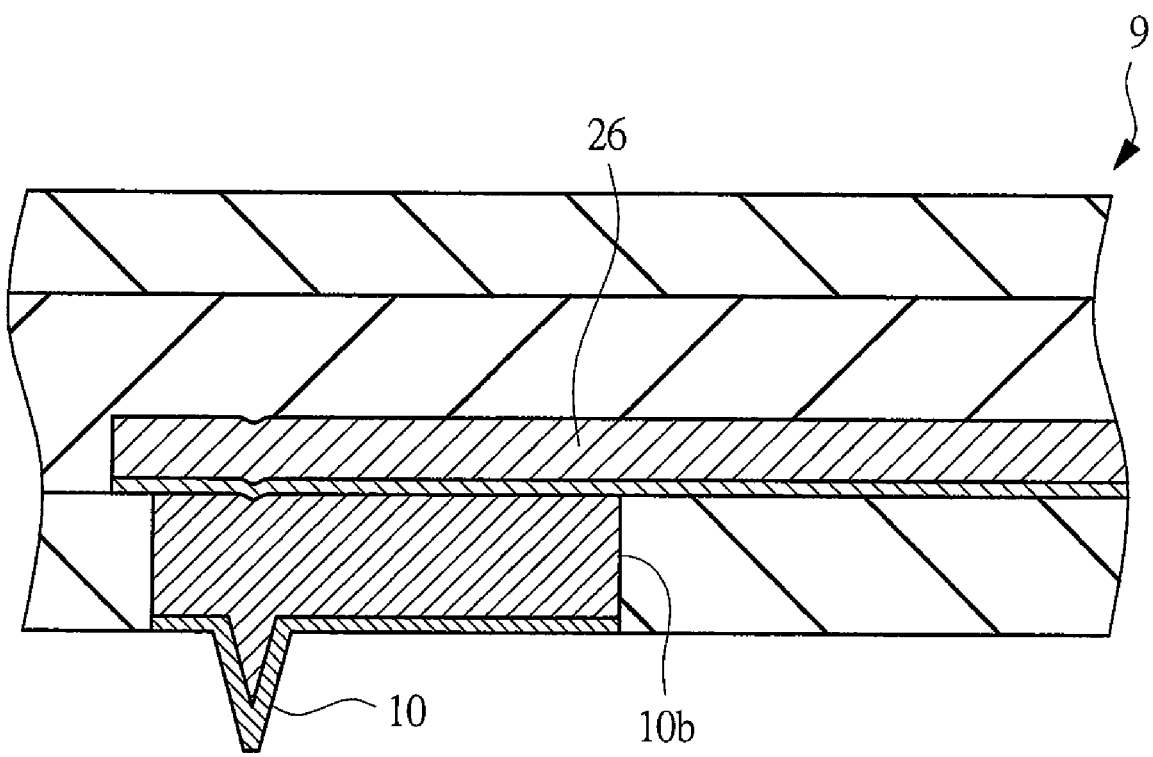
FIG. 9 is a sectional view of a main portion showing the vicinity of a contact terminal group of the probe card according to the third embodiment of the present invention in an enlarged manner.

FIG. 8 is a cross sectional view showing a main portion of a probe card according to a third embodiment and FIG. 9 is a sectional view of a main portion showing the vicinity of a contact terminal 10 of the probe card according to the third embodiment in an enlarged manner. The probe card according to the third embodiment will be explained with reference to FIGS. 8 and 9.

In the probe sheet 9, when a connection electrode portion 10b on which individual contact terminals 10 are formed and a wire material 26 are connected to each other, via holes are utilized in the first embodiment, but, in the third embodiment, via holes are omitted and a wire material 26 is directly formed on the surface of the connection electrode portion 10b (see FIG. 9). The other configuration of the third embodiment is similar to those of the first embodiment.

According to a probe sheet structure 25c of the third embodiment with such a structure, since a structure where via holes are omitted is obtained, a contact resistance value between the connection electrode portion 10b and the wire material 26 can be reduced. At steps of manufacturing the probe sheet 9, since a step of forming the via holes can be omitted, TAT (Turn Around Time) of manufacture of the probe sheet 9 can be reduced. Further, since a mask for forming via holes can be omitted, manufacturing cost for the probe sheet 9 can be reduced.

By adopting the probe sheet structure 25c according to the third embodiment with a structure as described above, effects similar to those of the first embodiment can be obtained.

Fourth Embodiment

Figure 10:
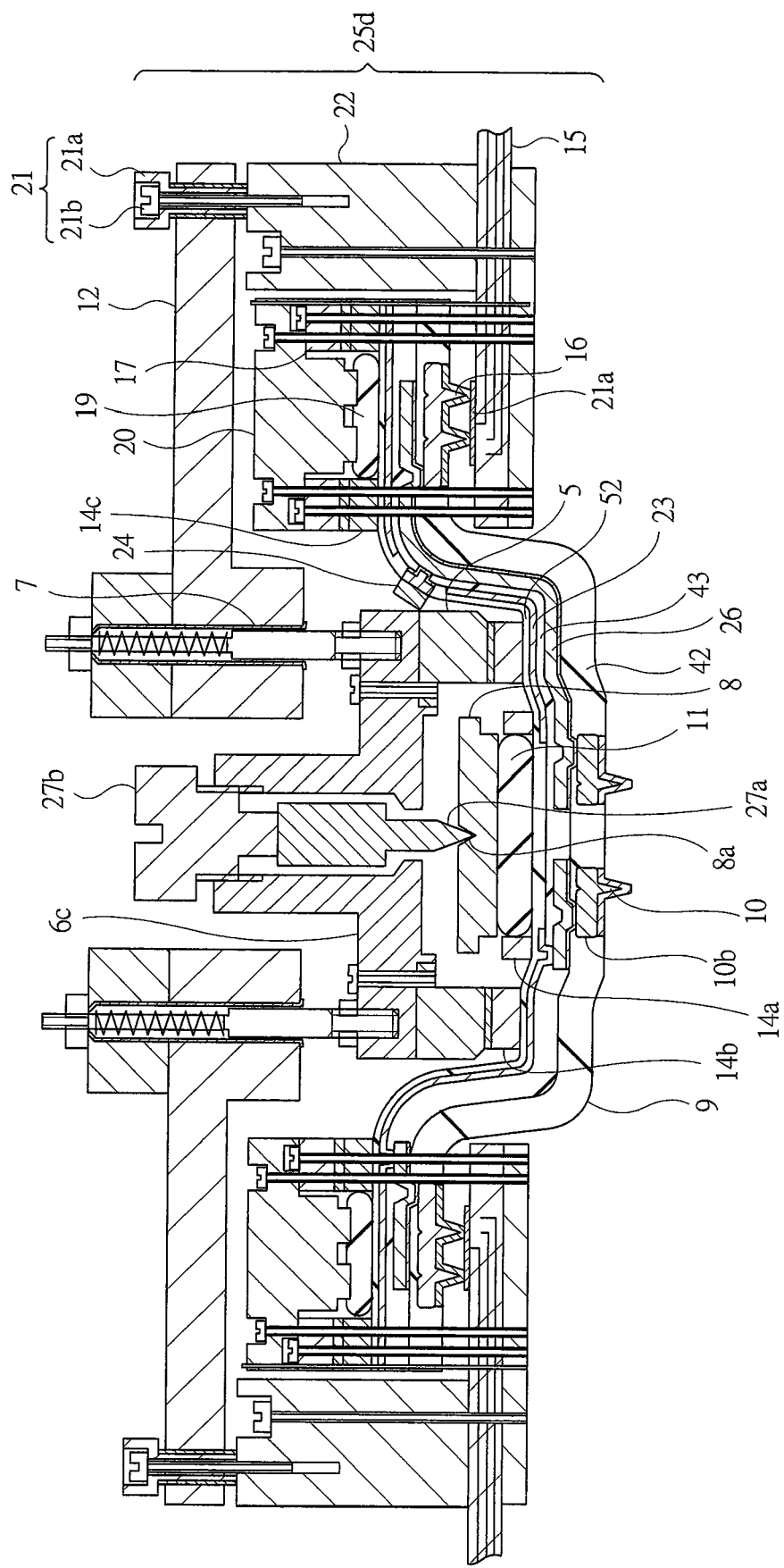
FIG. 10 is a sectional view of a main portion of the probe card according to the fourth embodiment of the present invention.

FIG. 10 is a cross sectional view showing a main portion of a probe card according to a fourth embodiment. The probe card according to the fourth embodiment will be explained with reference to FIG. 10.

The probe card according to the fourth embodiment includes a supporting member 12, guide pins 7, an intermediate plate 6c, a frame 5, and the like.

The guide pins 7 are inserted into the supporting member 12 to be screwed to the intermediate plate 6c, as also explained regarding the first embodiment with reference to FIG. 2.

The intermediate plate 6c is provided with a protrusion 27a and an adjustment screw 27b. The protrusion 27a is fixed to a central portion of the intermediate plate 6c so as to be adjustable in a projecting direction of the probe sheet 9 to serve as a center pivot, and the adjustment screw 27b can adjust the probe sheet 9 to a desired projecting amount via a movable pushing piece 8 about a distal end of the protrusion portion 27a serving as a fulcrum.

The frame 5 is bonded and fixed to a back face of the probe sheet 9 so as to surround the region where the contact terminal 10 group of the probe sheet 9 has been formed as also explained in the first embodiment with reference to FIG. 2.

A cushioning material 11 made from silicone sheet or the like and a pushing piece 8 are arranged at a central portion between the back face of the region of the probe sheet 9 where the contact terminal 10 group has been formed and the intermediate plate 6c, and the intermediate plate 6c is fixed to the frame 5 in a screw manner.

Here, the probe card according to the fourth embodiment is provided with a following or copying mechanism having a structure where the pushing piece 8 is held by the protrusion portion 27a provided at a central portion of the intermediate plate 6c so as to be finely tilable and the intermediate plate 6c is held so as to be capable of be finely tilted by the plurality of spring-incorporated guide pins (see FIG. 5) and the plurality of positioning-dedicated guide pins (see FIG. 5) screwed to the intermediate plate 6c so that a desired constant pressing force is provided (pressing is performed). Such a probe card according to the fourth embodiment has such a configuration that pressurizing of the contact terminal 10 group to the electrode 3 group on a semiconductor element 2 or the like is started in a low load state where both the groups are approximately parallel to each other and a following behavior of the contact terminal 10 group is secured so that the contact terminal(s) and the electrode(s) 3 on the semiconductor element 2 or the like can be prevented from being damaged.

A probe sheet structure 25d according to the fourth embodiment is formed using various members such as described above.

By adopting the probe sheet structure 25d according to the fourth embodiment with a structure as described above, effects similar to those of the first embodiment can be obtained.

Fifth Embodiment

Figure 11:
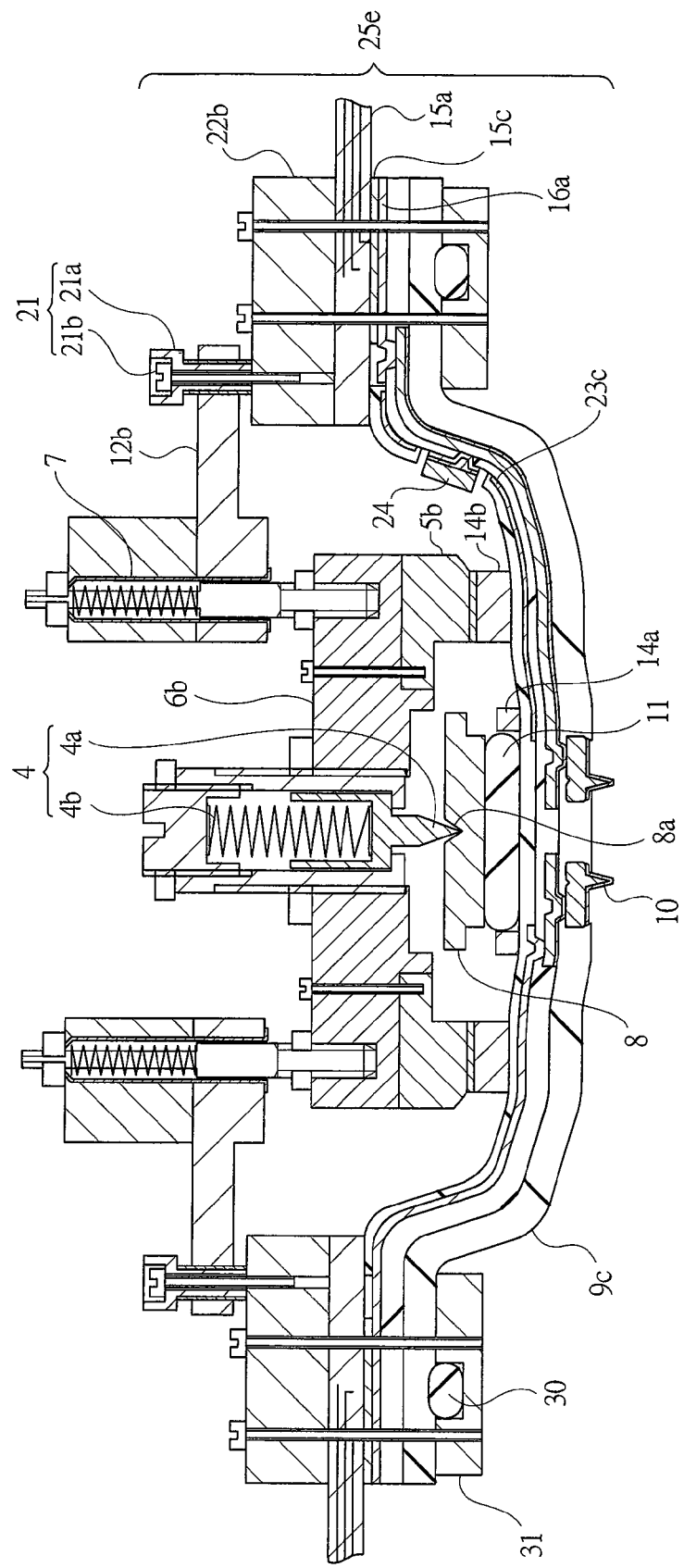
FIG. 11 is a sectional view of a main portion of the probe card according to the fifth embodiment of the present invention.
Figure 12:
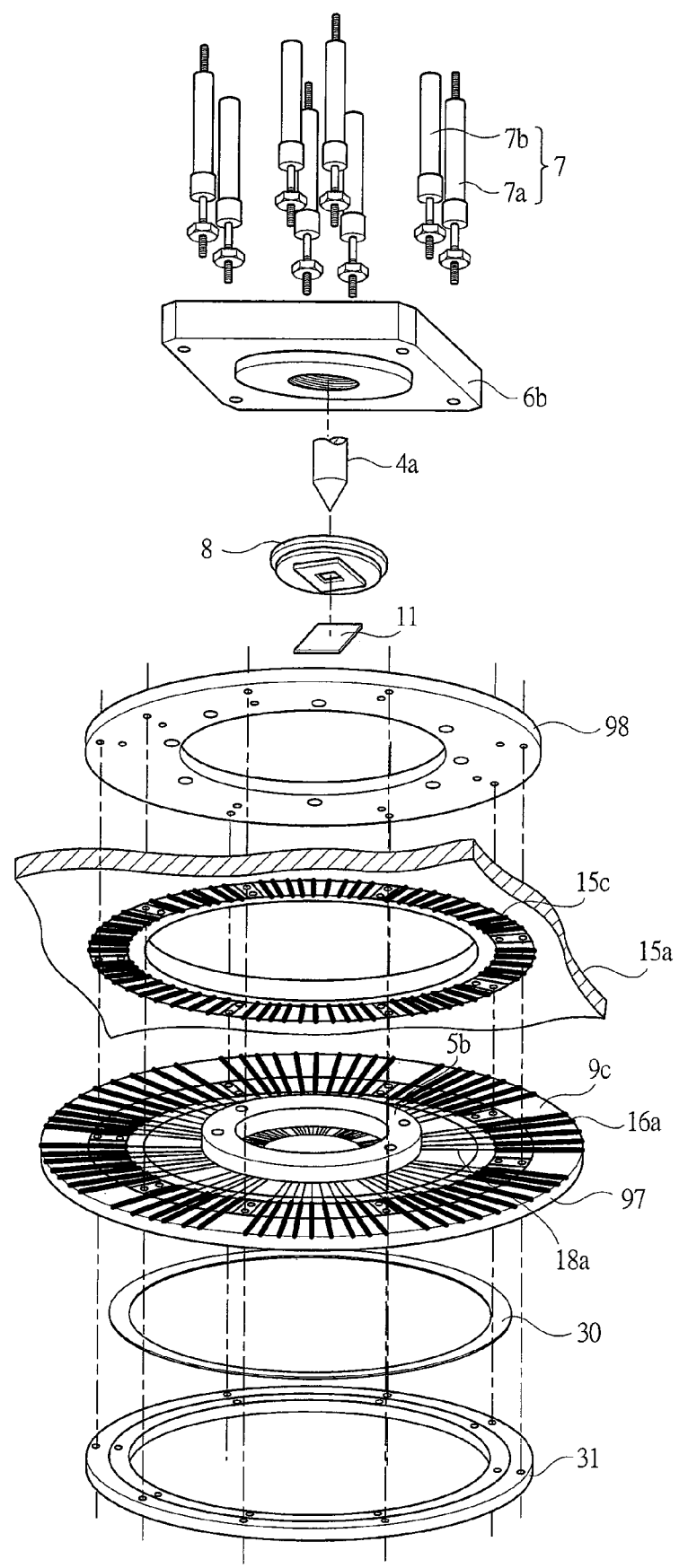
FIG. 12 is a perspective view showing main parts of the probe card shown in FIG. 11 in an exploded manner.

FIG. 11 is a cross sectional view showing a main portion of a probe card according to a fifth embodiment and FIG. 12 is a perspective view showing main parts shown in FIG. 11 in an exploded manner. The probe card according to the fifth embodiment will be explained with reference to FIGS. 11 and 12.

The probe card according to the fifth embodiment includes a spring plunger 4, a frame 5b, an intermediate plate 6b, guide pins 7, and the like.

The spring plunger 4 is fixed to a central portion of the intermediate plate 6b so as to be adjustable in a height direction thereof, it has a protrusion portion 4a at its lower distal end so as to serve as a center pivot, and it has a loaded spring 4b which imparts pressing force to a probe sheet 9 via a pushing piece 8 movable about a distal end of the protrusion portion 4a serving as a fulcrum.

The frame 5b is bonded and fixed to a back face of the probe sheet 9c so as to surround a region of the probe sheet 9c where a contact terminal 10 group has been formed.

A cushioning material 11 made from silicone sheet or the like and a pushing piece 8 are arranged at a central portion between the back face of the region of the probe sheet 9c where the contact terminal 10 group has been formed and the intermediate plate 6b, and the intermediate plate 6b is fixed to the frame 5b in a screw manner.

The guide pins 7 are inserted into a supporting member (an upper fixing plate) 12b to be screwed to the intermediate plate 6b. The guide pins 7 are configured such that spring-incorporated guide pins 7a having a spring 13 built-in and positioning-dedicated guide pins 7b as shown in FIG. 5 are used in order to prevent positional deviation of contact terminal distal ends at a time of inspecting the probing as much as possible and realize the desired approximately constant pressing force (for example, in case of about 500 pins, about 5 to 10N in a pushing-in amount of about 150 μm) in a movable (finely tiltable) state in a state that the region where the contact terminals 10 group has been formed, as also explained regarding the above-mentioned embodiment. The plurality of spring-incorporated guide pins 7a and the plurality of positioning-dedicated guide pins 7b are inserted into the supporting member 12b to be screwed and fixed to the intermediate plate 6b.

The probe sheet 9c is formed with a contact terminal 10 group for contacting with an electrode 3 group of the semiconductor element 2 on a central region portion at a probing (main face) side of the probe sheet 9c, and it is formed with a metal film 14a and a metal film 14b on a region corresponding to the frame 5b so as to surround a periphery of the contact terminal 10 group doubly. A peripheral electrode 16a group for signal communication with a multi-layered wiring board 15a is formed on a peripheral portion of the probe sheet 9c, and many leading wires 18a are formed between the contact terminal 10 group and the peripheral electrode 16a group. The peripheral electrode 16a group can be connected to the electrodes 15c of the multi-layered wiring board 15a via an O-ring 30 disposed so as to face a back face of the peripheral electrode 16a group by fixing an O-ring retainer ring 31 to the multi-layered wiring board 15a in a screw manner via the O-ring 30 on the back face side of the probe sheet 9c.

Further, the frame 5b is bonded and fixed to the back face of the probe sheet 9c corresponding to the region where the contact terminals 10 group has been formed, and the frame 5b is fixed to the intermediate plate 6b in a screw manner. The spring plunger 4 is fixed to the intermediate plate 6b and the protrusion portion 4a at the lower distal end is engaged with a conical groove 8a formed at an upper face center of the pushing piece 8. The guide pins 7 inserted into the supporting member 12b are fixed to the intermediate plate 6b by screws.

The pushing piece 8 has a compliance mechanism with such a structure that it is held by a protrusion 4a at a distal end of the spring plunger 4 provided at the center portion of the intermediate plate 6 to be finely tiltable and it provides a desired approximately constant pressing force (performs pressing) by the spring plunger 4. Incidentally, a conical groove 8a engaged with the protrusion portion 4a is formed at an upper face central portion of the pushing piece 8.

Figure 17:
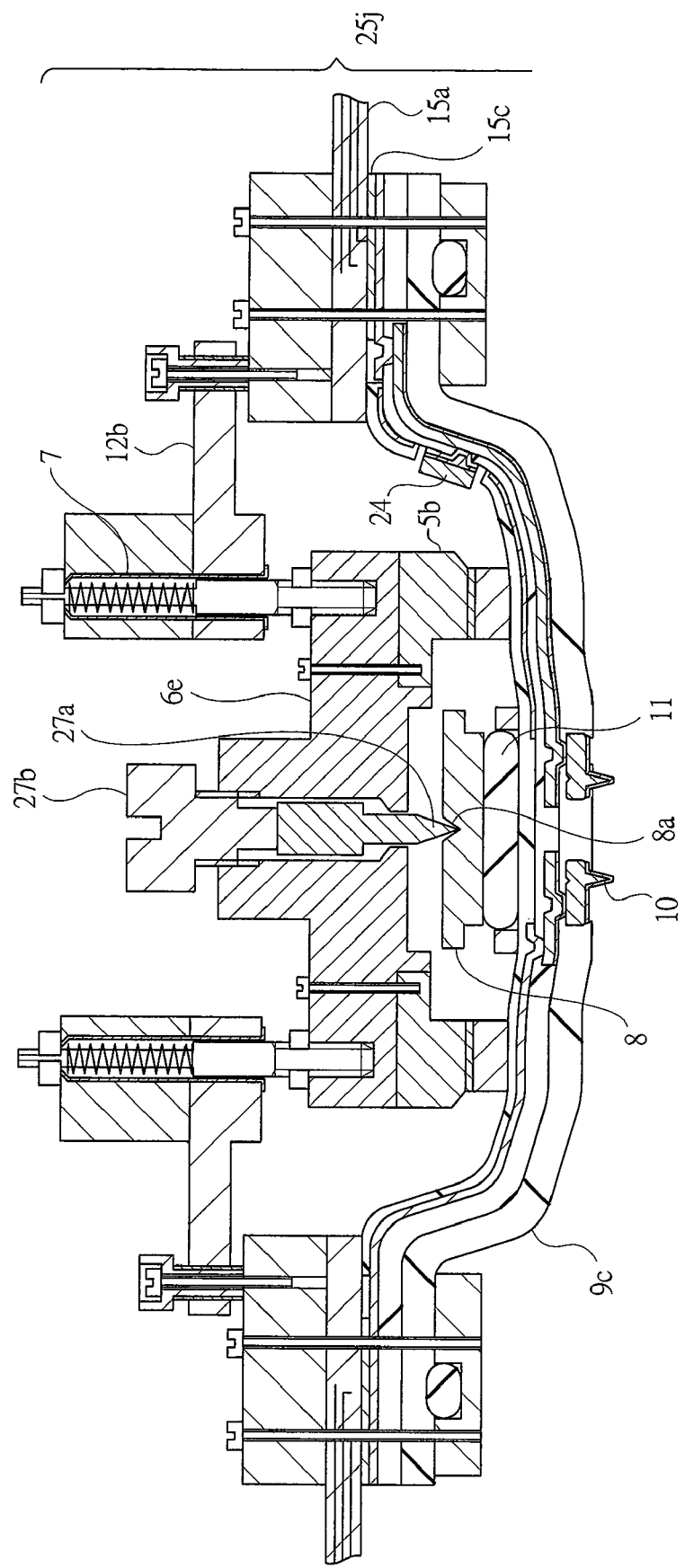
FIG. 17 is a sectional view of a main portion of the probe card according to the tenth embodiment of the present invention.
Figure 18:
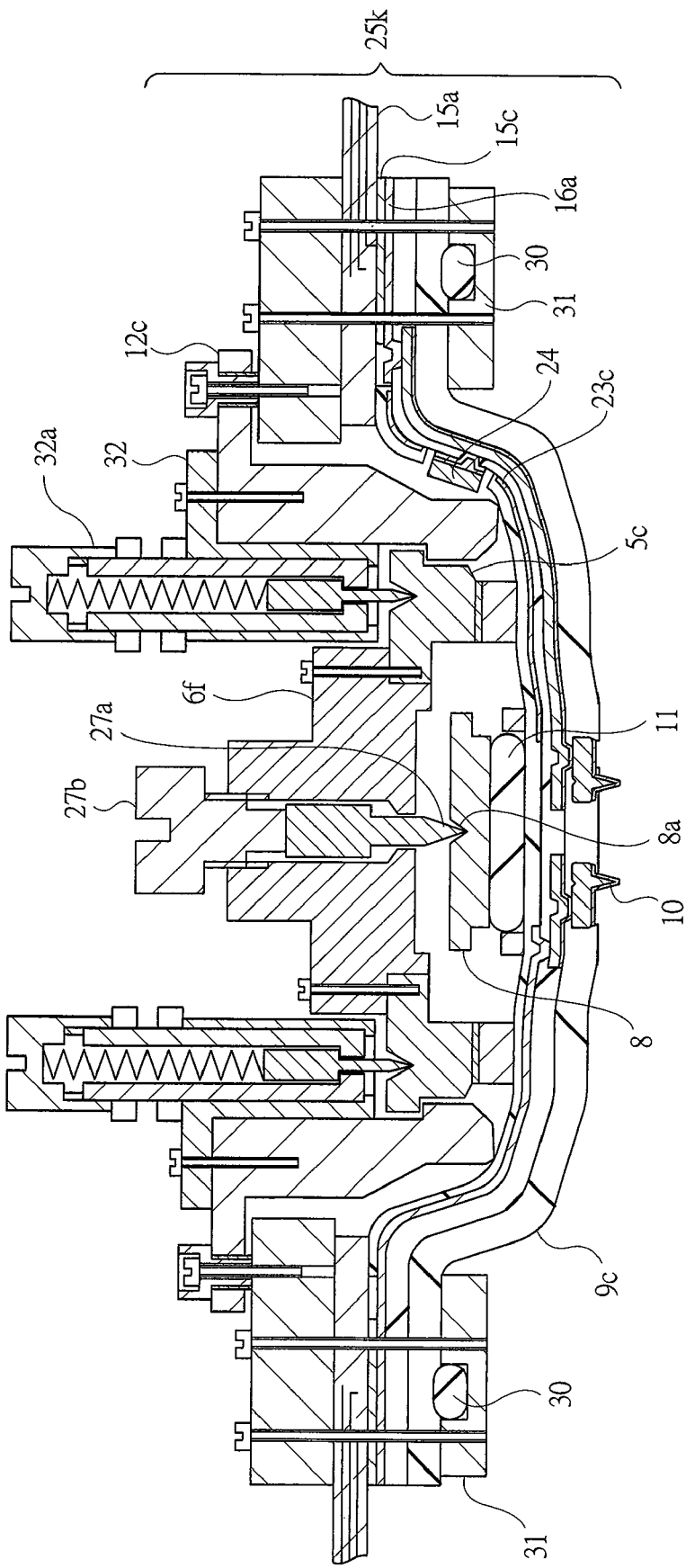
FIG. 18 is a sectional view of a main portion of the probe card according to the eleventh embodiment of the present invention.
Figure 19:
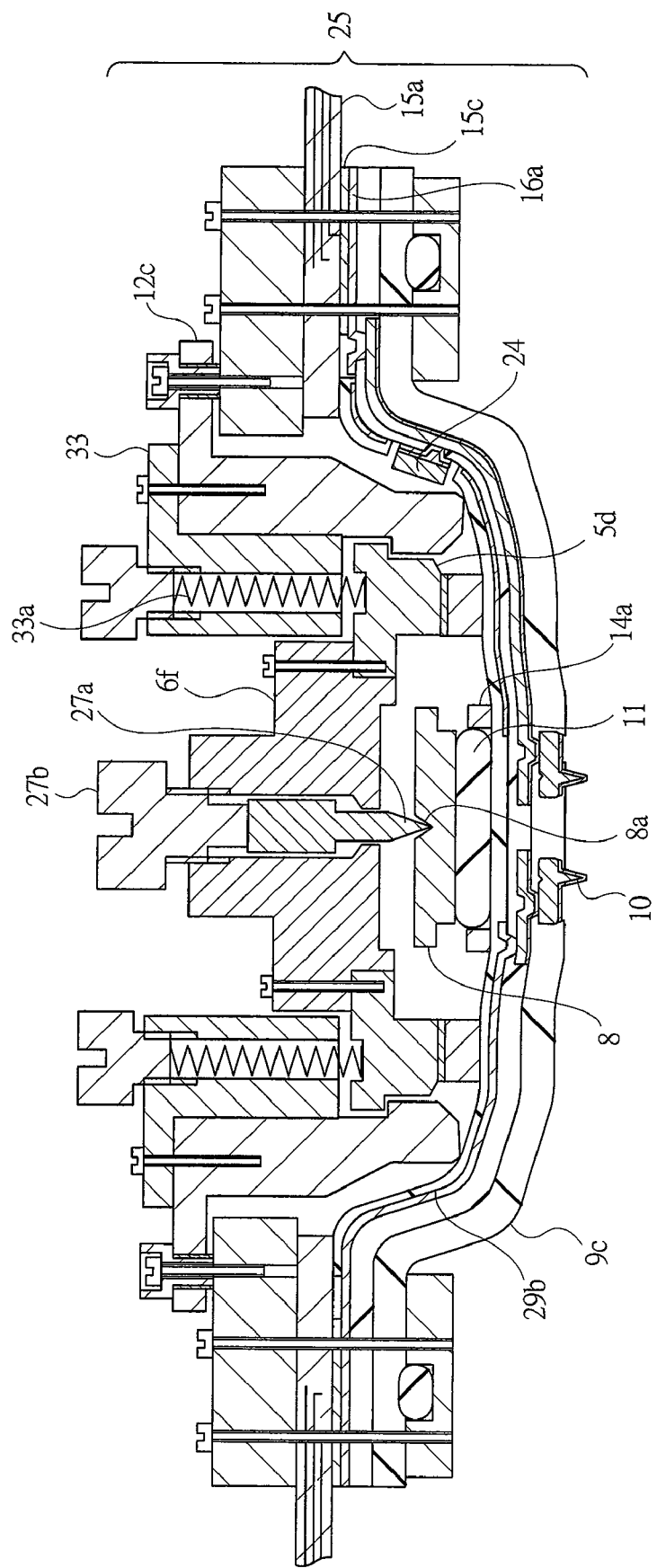
FIG. 19 is a sectional view of a main portion of the probe card according to the twelfth embodiment of the present invention.

Incidentally, the spring plunger 4 may be used in a state that it can be finely tiltable about the protrusion portion 4a serving as a fulcrum in a structure where the spring 4b has been omitted, as shown in FIGS. 17 to 19 described later.

Incidentally, inclination of the probe sheet 9c on the region where the contact terminal 10 group has been formed may be finely adjusted using a double screw 21 for fine adjustment of inclination provided on the supporting member 12b or a spacer (spacer 22a (see FIG. 6)). Here, the double screw 21 has a structure that another inner screw 21b is formed at a center of an outer screw 21a, and after inclinations of the supporting member 12b and an upper plate 22b are adjusted by adjusting a distance between the both using the outer screw 21a, fixation is conducted in a screw manner using the inner screw 21b.

A probe sheet structure 25e according to the fifth embodiment is formed using various members such as described above.

By adopting the probe sheet structure 25e according to the fifth embodiment with such a structure, effects similar to those of the first embodiment can be obtained.

Sixth Embodiment

Figure 13:
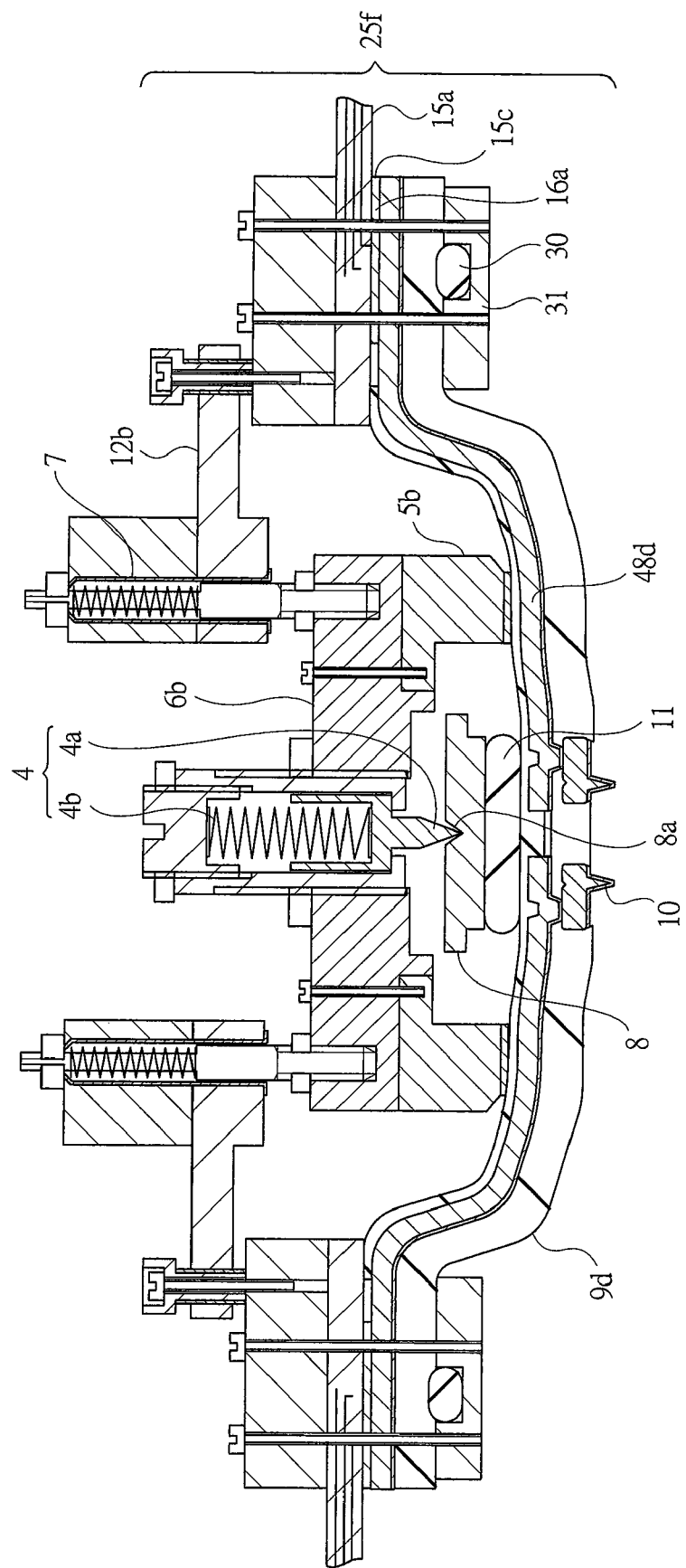
FIG. 13 is a sectional view of a main portion of the probe card according to the sixth embodiment of the present invention.

FIG. 13 is a cross sectional view showing a main portion of a probe card according to a sixth embodiment. The probe card according to the sixth embodiment will be explained with reference to FIG. 13.

In the fifth embodiment (see FIGS. 11 and 12), the case that the ground wire 23c is formed in the probe sheet 9c and the chip capacitor 24 is mounted thereon has been shown, but when high-speed electric inspection signals are not required so much, such a configuration that the ground wire 23c or the chip capacitor 24 has been omitted from a probe sheet 9d can be adopted.

In a configuration of the probe card explained below, such a configuration that the ground wire 23c or the chip capacitor 24 has been omitted from a probe sheet 9d can be adopted depending on a rate of inspection signal. The double screw 21 for fine adjustment of inclination or the spacer 22a can be used according to needs and it may be omitted, of course.

In FIG. 11 of the fifth embodiment, the example where the metal film 14a and the metal film 14b on the region corresponding to the frame 5b have been formed so as to surround the periphery of the contact terminal 10 group doubly has been shown, but one or both of the metal film 14a and the metal film 14b may be omitted according to accuracy of a distal end position of a required contact terminal(s), as shown in FIG. 13 of the sixth embodiment.

A probe sheet structure 25f according to the sixth embodiment is formed using various members as described above.

By adopting the probe sheet structure 25f according to the sixth embodiment with such a structure, effects similar to those of the first embodiment can be obtained.

Seventh Embodiment

Figure 14:
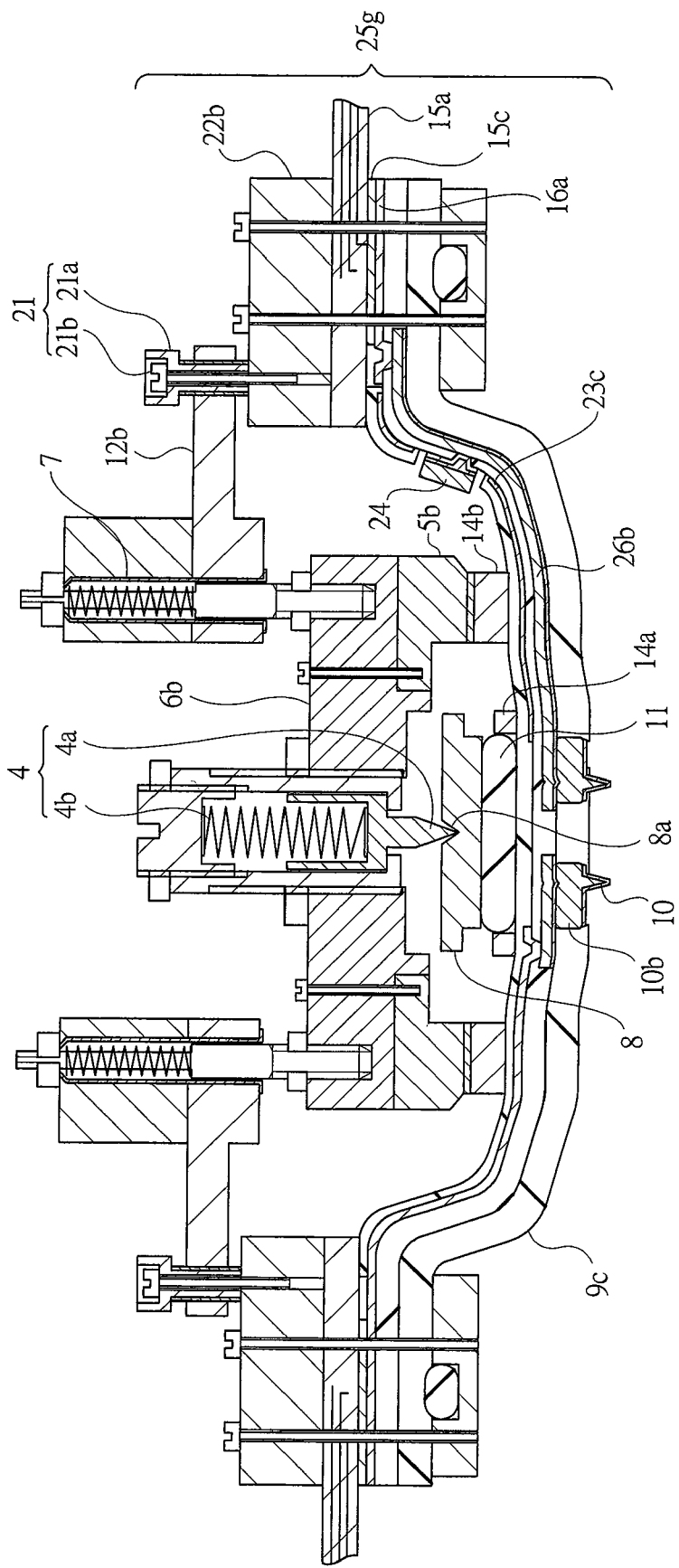
FIG. 14 is a sectional view of a main portion of the probe card according to the seventh embodiment of the present invention.

FIG. 14 is a cross sectional view showing a main portion of a probe card according to a seventh embodiment. The probe card according to the seventh embodiment will be explained with reference to FIG. 14.

When a contact electrode portion 10b formed with contact terminals 10 and a wire material thereon are connected to each other, the connection is performed using via holes in the fifth embodiment, but a wiring material 26b is directly formed on a surface of a connection electrode portion 10b without providing via holes in the seventh embodiment like the third embodiment (see FIGS. 8 and 9). The other configurations in the present embodiment are similar to those in the fifth embodiment.

A probe sheet structure 25g according to the seventh embodiment is formed using various members as described above.

By adopting the probe sheet structure 25g according to the seventh embodiment with a structure as describe above, effects similar to those of the first embodiment can be obtained.

Eighth Embodiment

Figure 15:
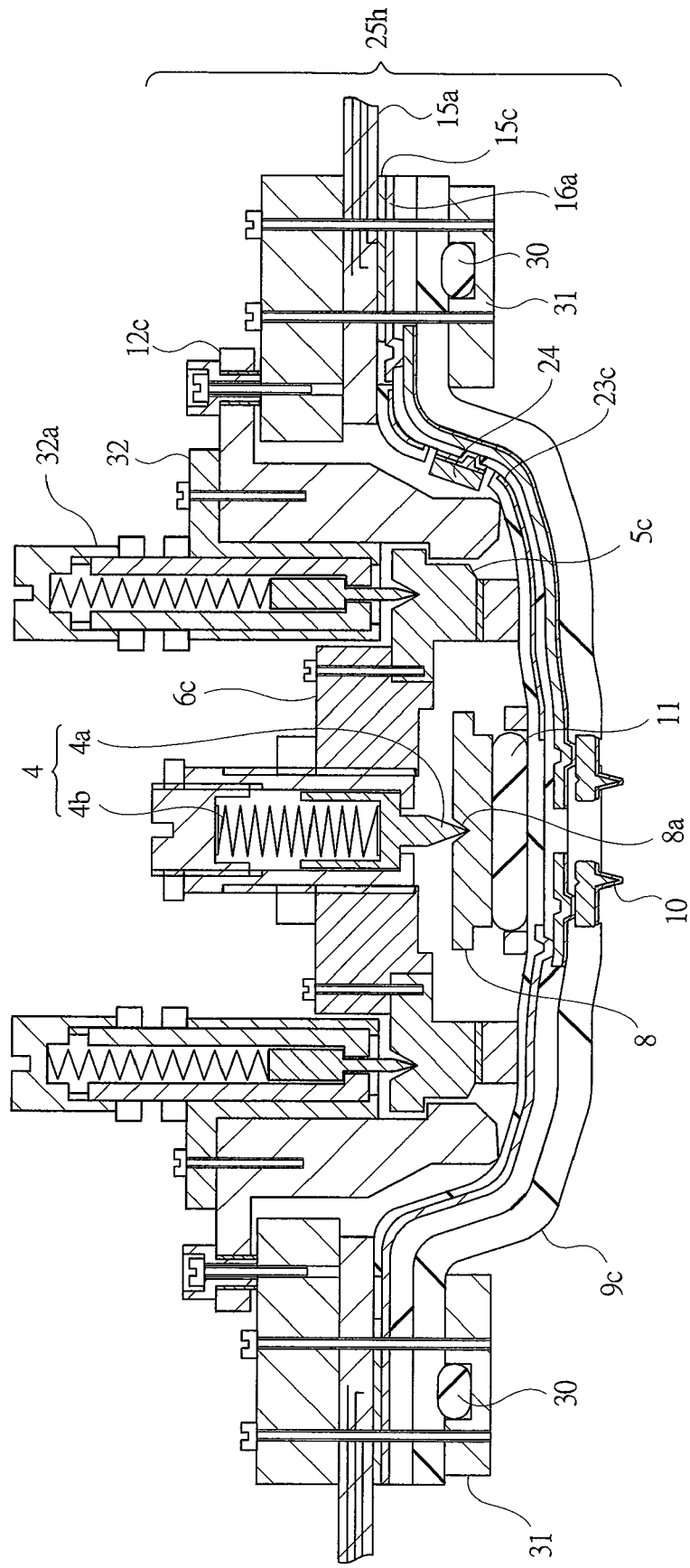
FIG. 15 is a sectional view of a main portion of the probe card according to the eighth embodiment of the present invention.

FIG. 15 is a cross sectional view showing a main portion of a probe card according to an eighth embodiment. The probe card according to the eighth embodiment will be explained with reference to FIG. 15.

In the eighth embodiment, a following or copying pressing mechanism having a structure using spring plungers 32a fixed to a spring plunger holding member 32 is configured instead of the guide pins 7 fixed to the intermediate plate 6c in the probe card (see FIG. 10) according to the fifth embodiment in a screw manner.

That is, the probe card according to the eighth embodiment has a structure provided with a supporting member 12c, the spring plunger holding member 32, the spring plungers 32a, the spring plunger 4, a frame 5c, a cushioning material 11, a pushing piece 8, and the like.

The spring plunger holding member 32 is fixed to the supporting member 12c in a screw manner, and the spring plunger 32a is mounted to the spring plunger holding member 32.

The spring plunger 4 is fixed to a central portion of the intermediate plate 6c in an adjustable state in a height direction thereof, it has a protrusion portion 4a at a lower distal end so as to serve as a center pivot, and it has a loaded spring 4b which imparts pressing force to a probe sheet 9c via the pushing piece 8 movable about a distal end of the protrusion portion 4a.

The frame 5c is bonded and fixed to a back face of the probe sheet 9c so as to surround a region of the probe sheet 9c where the contact terminal 10 group has been formed.

The cushioning material 11 made from silicone sheet or the like and the pushing piece 8 are disposed at a central portion between the back face of the region of the probe sheet 9c where the contact terminal 10 group has been formed and the intermediate plate 6c, and the intermediate plate 6c is fixed to the frame 5c in a screw manner.

The probe card according to the eighth embodiment is provided with a following mechanism having a structure where the pushing piece 8 is held by the protrusion portion 4a at a distal end of the spring plunger 4 provided at a central portion of the intermediate plate 6c so as to be finely tilable and the intermediate plate 6c is held by a plurality of spring plungers 32a loaded on the plunger holding member 32 so as to be finely tilable so that a desired approximately constant pressing force is provided (performing pressing). Such a probe card according to the eighth embodiment has such a configuration that pressurizing of the contact terminal 10 group to the electrode 3 group on a semiconductor element 2 or the like is started in a low load state where both the groups are approximately parallel to each other and a following behavior of the contact terminal 10 group is secured so that the contact terminal(s) and the electrode(s) 3 on the semiconductor element 2 or the like can be prevented from being damaged.

A probe sheet structure 25h according to the eighth embodiment is formed using various members such as described above.

By adopting the probe sheet structure 25h according to the eighth embodiment with a structure as described above, effects similar to those of the first embodiment can be obtained.

Ninth Embodiment

Figure 16:
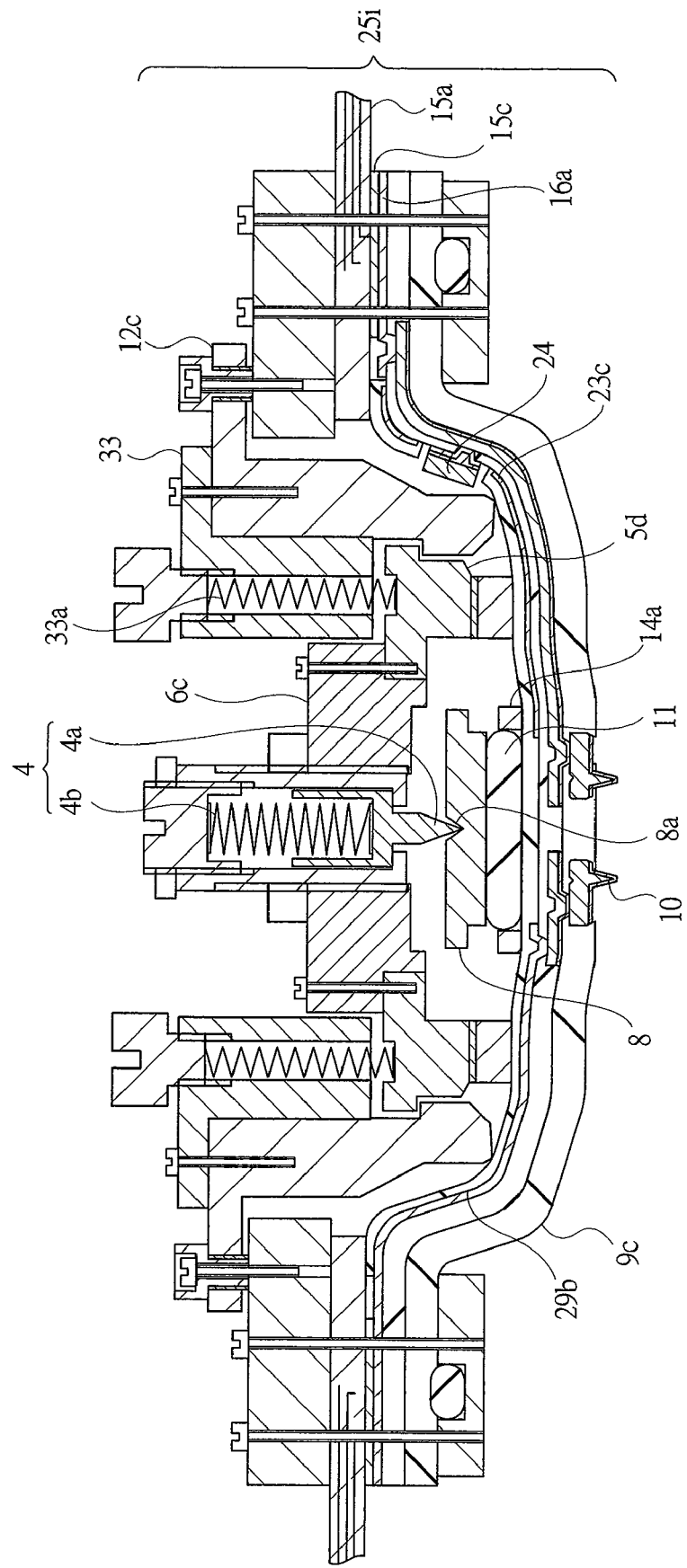
FIG. 16 is a sectional view of a main portion of the probe card according to the ninth embodiment of the present invention.

FIG. 16 is a cross sectional view showing a main portion of a probe card according to a ninth embodiment. The probe card according to the ninth embodiment will be explained with reference to FIG. 16.

The ninth embodiment is provided with a following pressing mechanism with a structure using a spring 33a held by a spring holding member 33 instead of the spring plunger 32a held by the spring plunger holding member 32 in the probe card according to the eighth embodiment. The other configurations of the ninth embodiment are similar to those of the eighth embodiment.

A probe sheet structure 25i according to the ninth embodiment is formed using various members such as described above.

By adopting the probe sheet structure 25i according to the ninth embodiment with such a structure as described above, effects similar to those of the first embodiment can be obtained.

Tenth Embodiment

FIG. 17 is a cross sectional view showing a main portion of the probe card according to a tenth embodiment. The probe card according to the tenth embodiment will be explained with reference to FIG. 17.

The probe card according to the tenth embodiment is provided with a supporting member 12b, guide pins 7, an intermediate plate 6e, a frame 5b, and the like.

The guide pins 7 are inserted through the supporting member 12b to be fixed to the intermediate plate 6e in a screw manner.

The intermediate plate 6e is provided with a protrusion portion 27a and an adjustment screw 27b. The protrusion portion 27a is fixed to a central portion of the intermediate plate 6e so as to be adjustable in a projecting direction of the probe sheet 9 to serve as a center pivot, and the adjustment screw 27b can adjust the probe sheet 9 to a desired projecting amount via a pushing piece 8 movable about a distal end of the protrusion portion 27a as a fulcrum.

The frame 5b is bonded and fixed to a back face of the probe sheet 9c so as to surround a region of the probe sheet 9c where a contact terminal 10 group has been formed.

A cushioning material 11 made from silicon sheet or the like and the pushing piece 8 are arranged at a central portion between the back face of the region of the probe sheet 9c where the contact terminal 10 group has been formed and the intermediate plate 6e, and the intermediate plate 6e is fixed to the frame 5b in a screw manner.

Here, the probe card according to the tenth embodiment is provided with a following mechanism with a structure where, while the pushing piece 8 is held by the protrusion portion 27a provided at a central portion of the intermediate plate 6e so as to be finely tilable and the intermediate plate 6e is held so as to be capable of be finely tilable by the plurality of spring-incorporated guide pins 7a (see FIG. 5) and the plurality of positioning-dedicated guide pins 7b (see FIG. 5) fixed to the intermediate plate 6e in a screw manner, a desired constant pressing force is imparted or provided (performing pressing). Such a probe card according to the tenth embodiment has such a configuration that pressurizing of the contact terminal 10 group to the electrode 3 group on a semiconductor element 2 or the like is started in a low load state where both the groups are approximately parallel to each other and a following behavior of the contact terminal 10 group is secured so that the contact terminal(s) and the electrode(s) 3 on the semiconductor element 2 or the like can be prevented from being damaged.

A probe sheet structure 25j according to the tenth embodiment is formed using various members such as described above.

By adopting the probe sheet structure 25j according to the tenth embodiment with such a structure as described above, effects similar to those of the first embodiment can be obtained.

Eleventh Embodiment

FIG. 18 is a cross sectional view showing a main portion of a probe card according to an eleventh embodiment. The probe card according to the eleventh embodiment will be explained with reference to FIG. 18.

The eleventh Embodiment is provided with a following pressing mechanism with a structure using spring plungers 32a fixed to a spring plunger holding member 32 instead of the guide pins 7 fixed to the intermediate plate 6e in the probe card (see FIG. 17) according to the tenth embodiment in a screw manner. An intermediate plate 6f is fixed to a frame 5c in a screw manner. The other configurations of the eleventh embodiment are similar to those of the tenth embodiment.

A probe sheet structure 25k according to the eleventh embodiment is formed using various members as described above.

By adopting the probe sheet structure 25k according to the eleventh embodiment with a structure as described above, effects similar to those of the first embodiment can be obtained.

Twelfth Embodiment

FIG. 19 is a cross sectional view showing a main portion of a probe card according to a twelfth embodiment. The probe card according to the twelfth embodiment will be explained with reference to FIG. 19.

The twelfth embodiment is provided with a following pressing mechanism with a structure using a plurality of springs 33a loaded on a spring holding member 33 instead of the plurality of guide pins 7 fixed to the intermediate plate 6e in a screw manner in the probe card (see FIG. 17) according to the tenth embodiment. The other configuration of the twelfth embodiment is similar to that of the tenth embodiment.

A probe sheet structure 25l according to the twelfth embodiment is formed using various members such as described above.

By adopting the probe sheet structure 25l according to the twelfth embodiment with a structure as described above, effects similar to those of the first embodiment can be obtained.

Examples corresponding to the best mode for carrying out the invention will be explained below.

Thirteenth Embodiment

Next, regarding one example of a probe sheet (a probe sheet structure) used in the probe card explained in the embodiments 1 to 12, a manufacturing method thereof will be explained with reference to FIG. 20A to FIG. 21C. Incidentally, respective members used for forming the subsequent probe sheet are properly shown in cross-sectional view of the main portions of the probe cards according to the first to twelfth embodiments shown in FIGS. 2 to 19.

FIGS. 20A to 20F and FIGS. 21A to 21C show a manufacturing process among the manufacturing processes for forming the probe card shown in FIG. 2 in the first embodiment in the order of steps, especially, using a truncated pyramid-shaped hole 40a formed in a silicon wafer 40, which is a mold material, by anisotropic etching as a mold material to integrally form a truncated pyramid-shaped contact terminal portion 41 and wiring material 26 for leading wiring on a polyimide film 42, further forming a polyimide film 43 and wiring material 26c thereon, further joining a metal film 14 at a bonding layer 52 and forming a probe sheet 9 with a frame 5 fixed to the metal film 14.

Figure 20A:
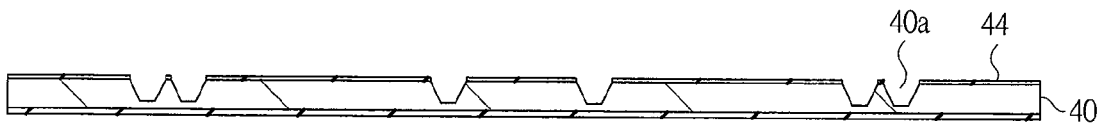
FIGS. 20A to 20F are sectional views of a main portion showing one portion of a manufacturing process forming a probe sheet (a probe sheet structure) portion in the probe card according to the thirteenth embodiment of the present invention.

A step shown in FIG. 20A is first performed. The step is a step of forming a silicon dioxide film 44 with a thickness of about 0.5 µm by conducting thermal oxidation to both faces of (100) face of a silicon wafer 40 with a thickness of 0.2 to 0.6 mm, conducting application of photoresist, and forming a pattern where photoresist at a position where truncated pyramid-shaped holes should be formed has been removed. Next, the silicon dioxide film 44 is removed in an etching manner using mixture of fluorinated acid and ammonium fluoride and utilizing the photoresist as a mask, and the silicon wafer 40 is anisotropically etched using strong alkaline solution (for example, potassium hydrate) utilizing the silicon dioxide film 44 as a mask to form truncated pyramid-shaped holes 40a.

Here, in the thirteenth embodiment, the silicon wafer 40 has been used as the mold material, but any material using crystalline can be used as the mold material, and it may be modified variously with an allowable range, of course. In the thirteenth embodiment, the holes are formed in the truncated pyramid-shape by anisotropic etching, but the shape of each hole may be formed in a pyramid-shape, and it may be modified variously within a range allowing formation of a contact terminal 10 group in such an extent that stable contact resistance can be secured by a small needle pressure. Further, such a configuration may be adopted that a plurality of contact terminals can contact with one electrode to be contacted.

Figure 20B:
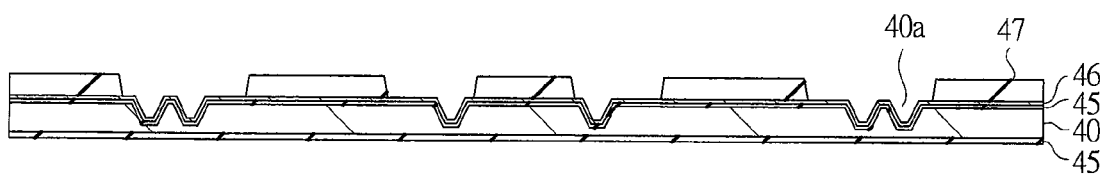

Next, a step shown in FIG. 20B is performed. At the step, the silicon dioxide film 44 which has been used as the mask is removed in an etching manner by mixture of fluorinated acid and ammonium fluoride, and a silicon dioxide film 45 with a thickness of about 0.5 µm is formed on a whole surface of the silicon wafer 40 by performing thermal oxidation in wet oxide atmosphere again. Next, a step of forming a conductive film 46 on a surface of the silicon dioxide film 45 and forming a photoresist mask 47 on a surface of the conductive film 46 so as to open a connection terminal portion 41 is performed.

Figure 20C:
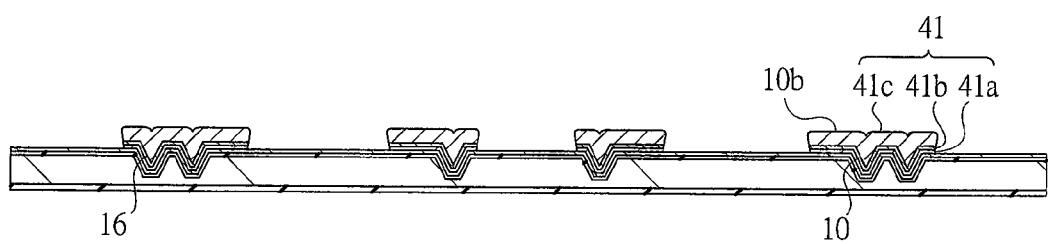

Next, a step shown in FIG. 20C is performed. At the step, a contact terminal 10 and a connection electrode portion 10b are integrally formed by performing electroplating of plating material whose main component is material with high hardness using the photoresist mask 47 as a mask and utilizing the conductive coating 46 as a current feeding layer. At this time, a peripheral electrode 16 having a structure similar to that of the contact terminal 10 is also formed. Thereafter, a step of removing the photoresist mask 47 is performed. A contact terminal portion 41 may be formed so as to integrally include the contact terminal 10 and the connection electrode portion 10b by sequentially plating, for example, nickel 41a, rhodium 41b, and nickel 41c as the plating materials with high hardness.

Figure 20D:
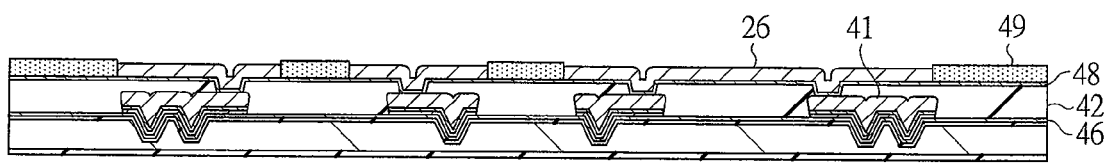

Next, a step shown in FIG. 20D is performed. At this step, a polyimide film 42 is formed so as to cover the contact terminal portion 41 and the conductive film 46, the polyimide film 42 at position where a hole for connection of a drawing wire from the contact terminal portion 41 should be formed is removed up to a surface of the contact terminal portion 41, conductive film 48 is formed on the polyimide film 42, and plating of wire material 26 is performed after a photoresist mask 49 is formed.

In order to remove a portion of the polyimide film 42, for example, laser boring process or dry etching utilizing an aluminum mask formed on a surface of the polyimide film 42 as a mask can be performed.

As the conductive film 48, for example, a chromium film with a thickness of about 0.1 µm may be formed by sputtering method or evaporation method using chromium, and a copper film with a thickness of about 1 µm may be formed on a surface of the chromium film by sputtering method or evaporation method using copper. As the wiring material 26, copper plating material or material obtained by performing nickel-plating on copper plating can be used.

Figure 20E:
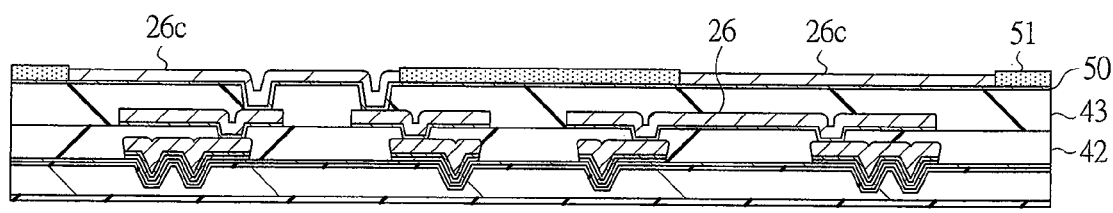

Next, a step shown in FIG. 20E is performed. At this step, after the photoresist mask 49 is removed and the conductive film 48 is removed using the wiring material 26 as a mask by soft etching process, a polyimide film 43 is formed, and the polyimide film 43 at a position where a hole for connection should be formed on an upper wiring material 26c is removed from the wiring material 26 up to a surface of the wiring material 26c. Next, after a conductive film 50 is formed on the polyimide film 43 and a photoresist mask 51 is formed, the wiring material 26c is plated.

In order to remove a portion of the polyimide film 43, for example, laser boring process or dry etching utilizing an aluminum mask formed on a surface of the polyimide film 43 as a mask can be performed similar to the case of the polyimide film 42.

As the conductive film 50, for example, after a chromium film with a thickness of about 0.1 µm is formed by sputtering method or evaporation method using chromium, a copper film with a thickness of about 1 µm may be formed on a surface of the chromium film by sputtering method or evaporation method using copper like the conductive film 48. As the wiring material 26, copper plating or material obtained by performing nickel-plating on copper plating can be used like the wiring material 26.

Figure 20F:
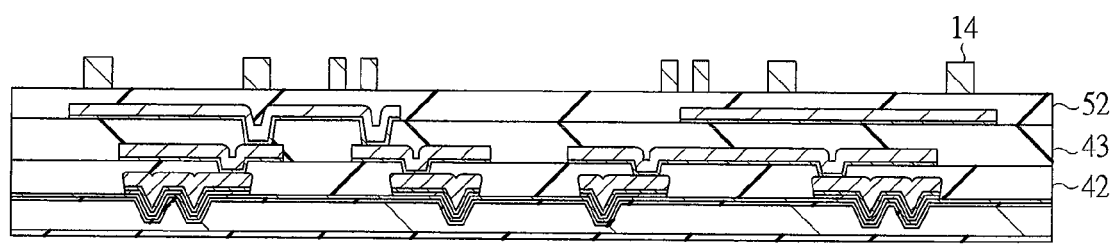

Next, a step shown in FIG. 20F is performed. At the step, after the photoresist mask 51 is removed and the conductive film 50 is removed using the wiring material 26 as a mask by soft etching process, an adhesion layer 52 and a metal film 14 are bonded to the polyimide film 43 and the wiring material 26c, and a pattern of a desired metal film 14 (metal films 14a to 14c) is formed by etching the metal film 14 using a photoresist mask.

Here, as the adhesion layer 52, for example, a polyimide base adhesion sheet or epoxy base adhesion sheet may be used. As the metal film 14, a metal sheet having a linear expansion coefficient close to that of the silicon wafer (silicon mold material) 40, such as 42 alloy (an alloy comprising nickel of 42% and iron of 58%, and having a linear expansion coefficient of 4 ppm/° C.) or invar (for example, an alloy comprising nickel of 36% and iron of 64% and having a linear expansion coefficient of 1.5 ppm/° C.) is used, and improvement of strength and expansion of an area of a probe sheet 9 formed by bonding the metal sheet to a polyimide film 43 formed with the wiring material 26c via the adhesion layer 52 can be achieved and high positional accuracy under various situations such as prevention of positional deviation due to a temperature at a time of inspection can be achieved. In view of this gist, a material with a linear expansion coefficient close to that of the semiconductor element 2 to be inspected may be used as the metal film 14 in order to secure high positional accuracy at a time of burn-in inspection.

At the bonding step, for example, the silicon wafer 40 formed with the contact terminal portion 41, the wiring material 26, and the polyimide film 43, and the adhesion layer 52 and the metal film 14 are stacked and heating and pressurizing bonding can be performed by applying a temperature of a glass transition temperature (Tg) or higher to these members while pressurizing them at a pressure of about 10 to 200 kgf/cm².

As the photoresist mask for patterning of the metal film 14, liquid-like resist or film-like resist (dry film) may be used.

Figure 21A:
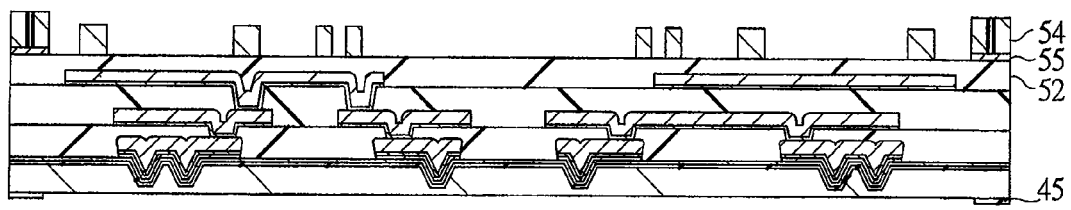
FIGS. 21A to 21C are sectional views of a main portion showing the manufacturing process subsequent to the step shown in FIG. 20F.

Next, a step shown in FIG. 21A is performed. At this step, as a pre-processing for the next step (see FIG. 21B), a face formed with the metal film 14 is first covered with a protective film, and the silicon dioxide film 45 on a region exposed from a lid 53b (see FIG. 21B) of a protective jig for silicon etching on an opposite face is removed in an etching manner using the protective film with a bored central portion as a mask and mixture of fluorinated acid and ammonium fluoride. Next, after the protective film is peeled off, a retaining ring 54 for silicon etching is bonded to the polyimide film 52 by adhesive 55. When a 42 alloy sheet or an invar sheet is used as the metal film 14, spray etching is performed using ferric chloride solution.

Figure 21B:
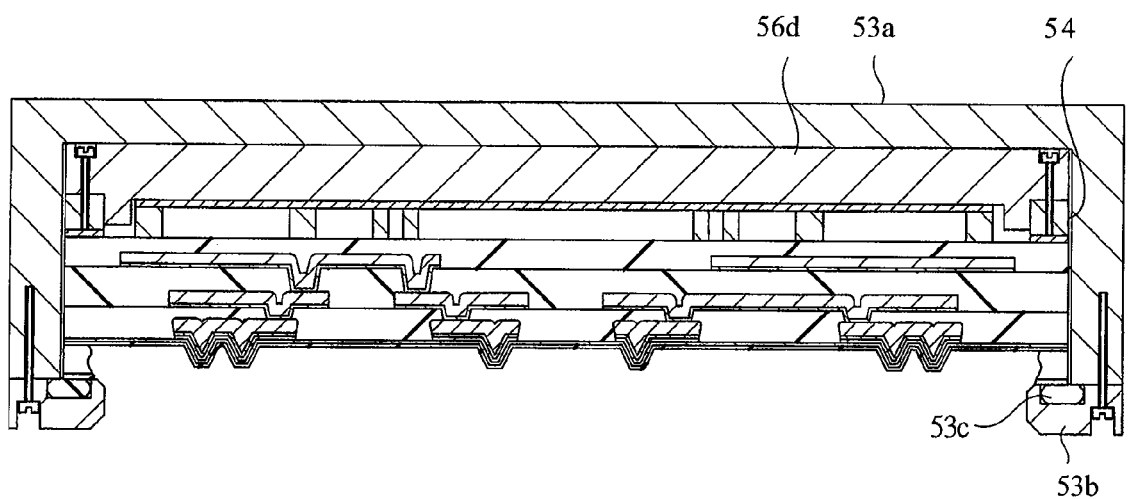

Next, a step shown in FIG. 21B is performed. At this step, a protecting jig for silicon etching is attached to the silicon wafer 40, and silicon is removed in an etching manner.

For example, the retaining ring 54 for silicon etching is fixed to an intermediate fixing plate 56d using a screw, an O-ring 53c is interposed between a fixing jig 53a made from stainless steel and a lid 53b made from stainless steel, and the silicon wafer 40 which is the mold member may be removed using strong alkaline liquid (for example, potassium hydrate) in an etching manner.

Figure 21C:
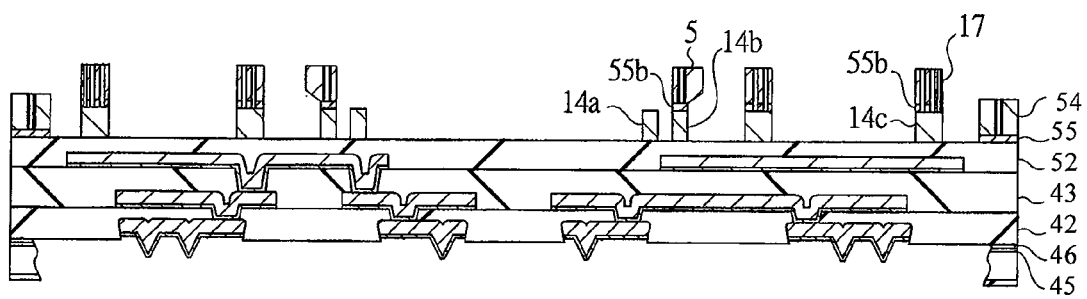

Next, a step shown in FIG. 21C is performed. At this step, the protective jig for silicon etching is removed, a protective film is bonded to the retaining ring 54 for silicon etching so as to cover one side face of the ring 54, the silicon dioxide film 45, the conductive film 46 (chromium and copper), and the nickel 41a are removed in an etching manner. Next, after the protective film is removed, adhesive 55b is applied between the metal film 14, and the frame 5 of and the peripheral electrode fixing plate 17 of the probe sheet so that fixation is performed at a predetermined position on the metal film 14.

The silicon dioxide film 45 is removed using mixture of fluorinated acid and ammonium fluoride in an etching manner, the chromium film is removed using potassium permanganate solution in an etching manner, and the copper film and the nickel film 41a may be removed using alkaline copper etchant in an etching manner.

Incidentally, as a result of the series of etching processing, the reason why the rhodium 41b exposed to the contact terminal surface is used is that solder, aluminum or the like which is material for the electrode 3 of the semiconductor element 2 is hard to adhere to the rhodium 41b, the rhodium 41b has higher hardness than that of nickel and it is hard to be oxidized, and a contact resistance of the rhodium 41b is stable.

Thereafter, the polyimide films 42 and 43, and the adhesion layer 52 are cut out along an outer periphery of the frame 5 and the peripheral electrode fixing plate 17, so that a probe sheet structure 25 (see FIG. 2) using the guide pins 7 is produced.

Incidentally, FIG. 3 and FIG. 4 are a perspective view and a sectional view, respectively, for explaining a step of assembling a probe sheet 9 cut out along an outer peripheral portion of a retaining ring for assembling step into a probe card.

Since a distal end of the peripheral electrode 16 of the probe sheet 9 contacts with the electrode 15b of the multi-layered wiring board 15 at a time of assembling the probe sheet 9 into a probe card, contact between the peripheral electrode 16 and the electrode 15b becomes stable so that electric characteristics at a time of the probing inspecting can be obtained.

Fourteenth Embodiment

Next, a manufacturing method of a probe sheet according to a fourteenth embodiment slightly different from the manufacturing method of the probe sheet 9 explained regarding the thirteenth embodiment will be explained with reference to FIGS. 22A to 22D.

FIGS. 22A to 22D show a manufacturing process for forming a probe sheet 9 (see the third embodiment and FIG. 8) slightly different from that of the thirteenth embodiment in the order of steps.

When the connection electrode portion 10b formed with contact terminals 10 and the wiring material 26 are connected to each other, the wiring material 26 is formed utilizing via holes in the thirteenth embodiment, but the wiring material 26 is directly formed on the surface of the connection electrode portion 10b without forming via holes in the manufacturing steps according to the fourteenth embodiment. Other structures are same as the thirteenth embodiment.

Figure 22A:
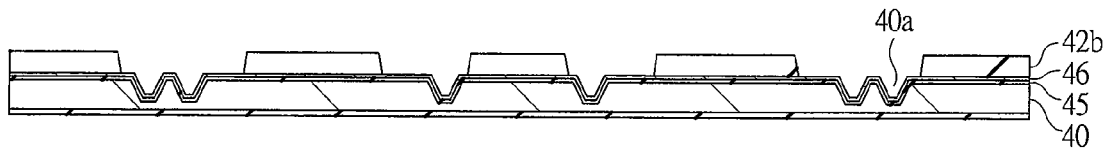
FIGS. 22A to 22D are sectional views of a main portion showing one portion of a manufacturing process forming a probe sheet (a probe sheet structure) portion in a probe card according to a fourteenth embodiment of the present invention.

First, a pyramid-shaped etching hole 40a is formed in the silicon wafer 40 shown in FIG. 22A, a silicon dioxide film 45 is formed on a surface of the pyramid-shaped etching hole 40a, and a polyimide film 42b is formed on a surface of a conductive film 46 formed on the silicon dioxide film 45 via steps similar to those shown in FIGS. 20A and 20B in the thirteenth embodiment. Next, a step of removing a portion of the polyimide film 42b at a position where a contact terminal 10 should be formed is performed up to a surface of the conductive film 46.

As the conductive film 46, for example, a chromium film with a thickness of about 0.1 μm is formed by sputtering method or evaporation method using chromium, and a copper film with a thickness of about 1 μm is formed on a surface of the chromium film by sputtering method or evaporation method using copper. Resistance characteristics to laser processing can be increased by forming plating of copper with a thickness of several μm on the copper film.

In order to remove a portion of the polyimide film 42b, for example, laser boring process or dry etching utilizing an aluminum mask formed on a surface of the polyimide film 42b as a mask can be performed.

Figure 22B:
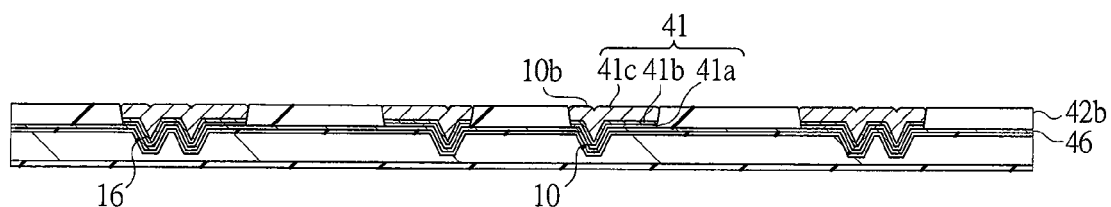

Next, a step shown in FIG. 22B is performed. First, electroplating of material containing material with high hardness as main component is performed to the conductive film 46 exposed at an opening portion of the polyimide film 42b utilizing the conductive film 46 as an electrode to form a contact terminal 10 and a connection electrode portion 10b integrally. A contact terminal portion 41 may be formed so as to integrally include the contact terminal 10 and the connection electrode portion 10b by sequentially plating, for example, nickel 41a, rhodium 41b, and nickel 41c as the plating materials with high hardness. At this time, a peripheral electrode 16 having a structure similar to that of the contact terminal 10 is also formed.

Figure 22C:
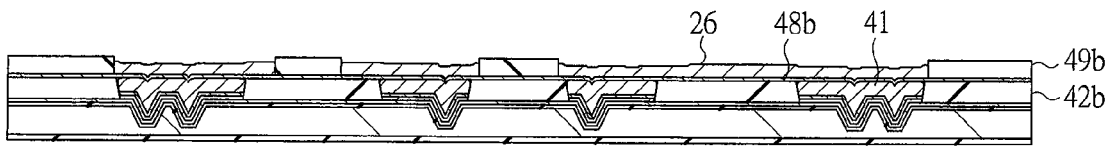

Next, a step shown in FIG. 22C is performed. First, a conductive film 48b is formed on the contact terminal portion 41 and the polyimide film 42b, and the wiring material 26 is plated after a photoresist mask 49b is formed.

As the conductive film 48b, for example, a chromium film with a thickness of about 0.1 μm is formed by sputtering method or evaporation method using chromium, and a copper film with a thickness of about 1 μm is formed on a surface of the chromium film by sputtering method or evaporation method using copper. Copper can be used as the wiring material 26.

Figure 22D:
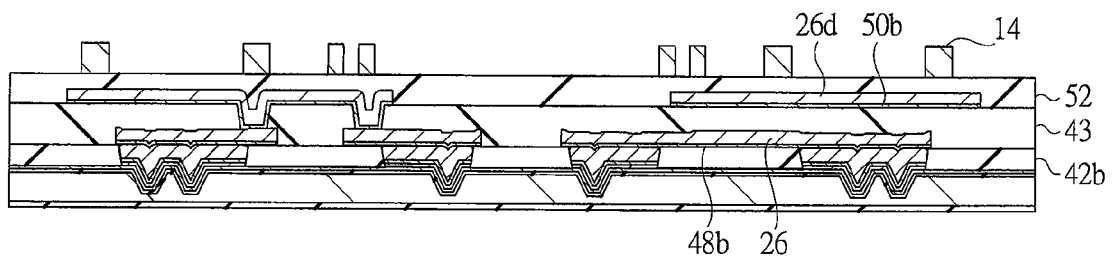

Next, a step shown in FIG. 22D is performed. At the step, after the photoresist mask 49b is removed and the conductive film 48b is removed in a soft etching manner using the wiring material 26 as a mask, a polyimide film 43 is formed, and a portion of the polyimide film 43 where a hole for connection should be formed in the upper wiring material 26d is removed from the wiring material 26 up to a surface of the wiring material 26. Next, after a conductive film 50b is formed on the polyimide film 43 and a photoresist mask is formed, the wiring material 26d is plated.

Subsequently, after the photoresist mask is removed and the conductive film 50b is removed in a soft etching manner using the wiring material 26d as a mask, the adhesion layer 52 and the metal film 14 are bonded to each other, and a desired pattern of the metal film 14 (metal films 14a to 14c) is formed by etching the metal film 14 using the photoresist mask as a mask.

In order to remove a part of the polyimide film 43, for example, laser boring process or dry etching utilizing an aluminum mask formed on a surface of the polyimide film 43 as a mask can be performed.

As the conductive film 50b, for example, a chromium film with a thickness of about 0.1 μm is formed by sputtering method or evaporation method using chromium, and a copper film with a thickness of about 1 μm is formed on a surface of the chromium film by sputtering method or evaporation method using copper like the conductive film 48b. As a wiring material 26d, copper plating material or material obtained by performing nickel-plating to copper plating can be used like the wiring material 26.

Next, a probe sheet structure 25c (see FIG. 8) according to the fourteenth embodiment is manufactured via steps similar to those explained in the thirteenth embodiment with reference to FIGS. 21A to 21C.

Fifteenth Embodiment

Figure 23A:
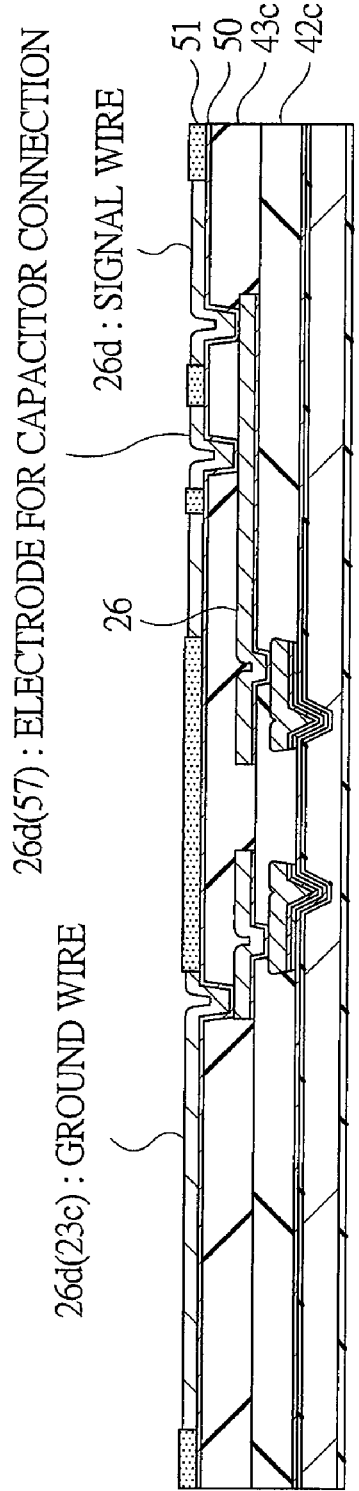
FIGS. 23A and 23B are sectional views of a main portion showing one portion of a manufacturing process forming a probe sheet (a probe sheet structure) portion in a probe card according to a fifteenth embodiment of the present invention.

Next, regarding a manufacturing method of a probe sheet according to a fifteenth embodiment, manufacturing steps thereof will be explained with reference to FIGS. 23A and 23B.

The manufacturing method of a probe sheet according to the fifteenth embodiment is similar to the manufacturing method of a probe sheet 9 described in the thirteenth embodiment (see FIGS. 20A to 21C) except that a step of forming all the peripheral electrodes 16a on an opposite face to a formation face of the contact terminals 10 in order to bring the peripheral electrodes 16a of the probe sheet 9c (see the fifth embodiment and FIG. 11) in contact with the electrodes 15c of the multi-layered wiring board 15a is adopted.

In the manufacturing method of a probe sheet according to the fifteenth embodiment, polyimide films 42c and 43c, wiring material 26, a conductive film 50, and the like are formed via steps similar to those explained in the thirteenth embodiment with reference to FIGS. 20A to 20E, and after a photoresist mask 51 is formed on these respective members, the wiring material 26d is then plated. A portion of the wiring material 26d serves as a ground wire 23c electrically connected to a predetermined contact terminal 10, and another portion thereof serves as an electrode 57 for capacitor connection for mounting a chip capacitor 24 (see FIG. 23A).

As explained in the first embodiment, current flows in the ground wire 23c of the wiring material 26d electrically connected to the reference potential (ground potential) and a wire thereof electrically connected of the power source at a time of probing inspecting, are larger than that in the other wires of the wiring material 26d. Therefore, the ground wire 23 and the wire electrically connected to the power source are each formed to have a wire width larger than that of the other wiring material 26d, thereby reducing wire resistance.

Figure 23B:
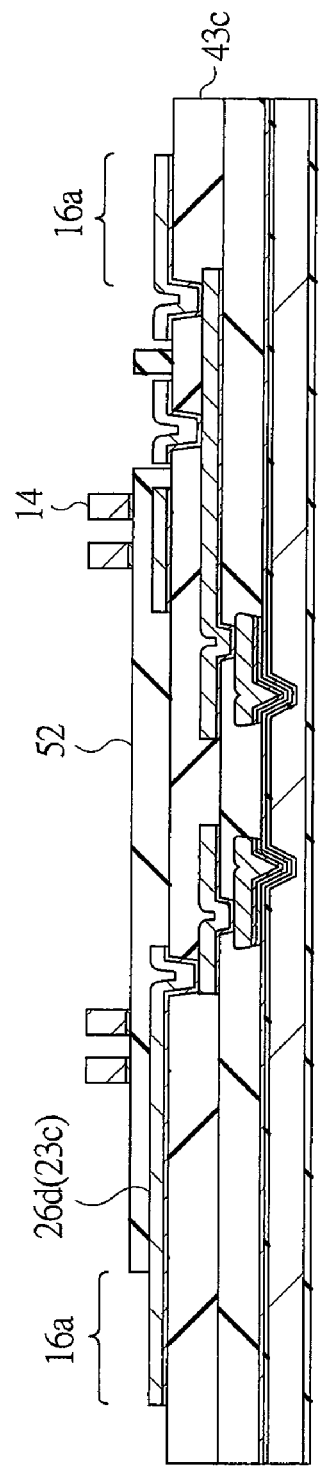

Next, a step shown in FIG. 23B is performed. At the step, after the photoresist mask 51 is removed and the conductive film 50 is removed in a soft etching manner using the wiring material 26d as a mask, a connection layer 52 and a metal film 14 are bonded in a state that a portion of the peripheral electrode 16a which is a portion of the wiring material 26d has been exposed so as to cover the wiring material 26d and the polyimide film 43c. Next, a desired pattern of the metal film 14 (metal films 14a and 14b (see FIG. 11)) is formed by etching the metal film 14 using the photoresist mask as a mask.

Next, a probe sheet structure 25e using the guide pins 7 shown in FIG. 11 is manufactured via steps similar to those explained in the thirteenth embodiment with reference to FIGS. 21A and 21C.

Incidentally, in order to stabilize a high-speed transmission signal, a chip capacitor 24 may be disposed between the wiring material 26d to be the electrode 57 for capacitor connection and the wiring material 26d for the ground wire 23c according to need.

Sixteenth Embodiment

Next, regarding a manufacturing method of a probe sheet according to a sixteenth embodiment, manufacturing steps thereof will be explained with reference to FIGS. 24A and 24B.

In the manufacturing method of a probe sheet according to the sixteenth embodiment, all the peripheral electrodes 16a are formed on an opposite face to a formation face of the contact terminals 10 in order to bring the peripheral electrodes 16a of the probe sheet 9d (see the sixth embodiment and FIG. 13) in contact with the electrodes 15c of the multi-layered wiring board 15a like the manufacturing method of a probe sheet 9c according to the fifteenth embodiment. However, this method is a manufacturing method in a case of a probe sheet structure where signal wires and a power source wire which are wring material in the probe sheet 9d have been formed on the same or one face.

Figure 24A:
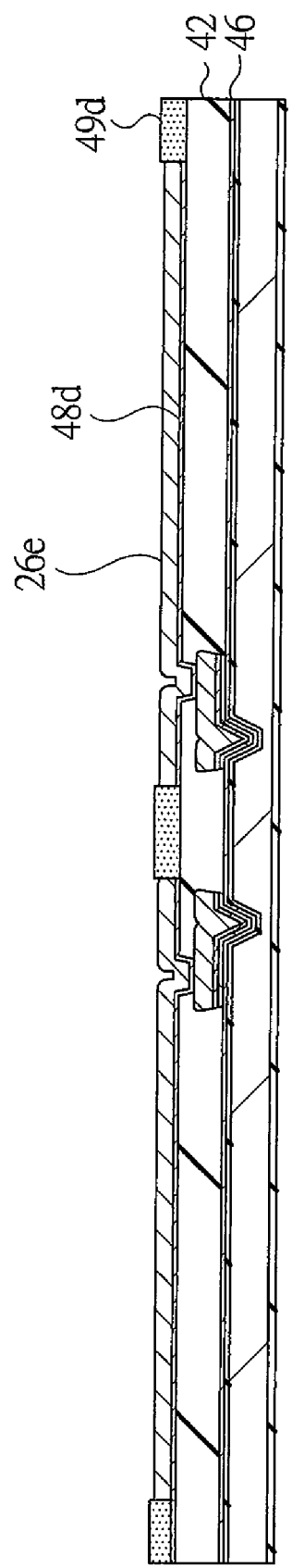
FIGS. 24A and 24B are sectional views of a main portion showing one portion of a manufacturing process forming a probe sheet (a probe sheet structure) portion in a probe card according to a sixteenth embodiment of the present invention.

First, a step shown in FIG. 24A is performed. At this step, a conductive film 46, a polyimide film 42, a conductive film 48d, and the like are formed via steps similar to those explained in the thirteenth embodiment with reference to FIGS. 20A to 20D, and after a photoresist mask 49d is formed on these members, and wiring material 26e is then plated.

Figure 24B:
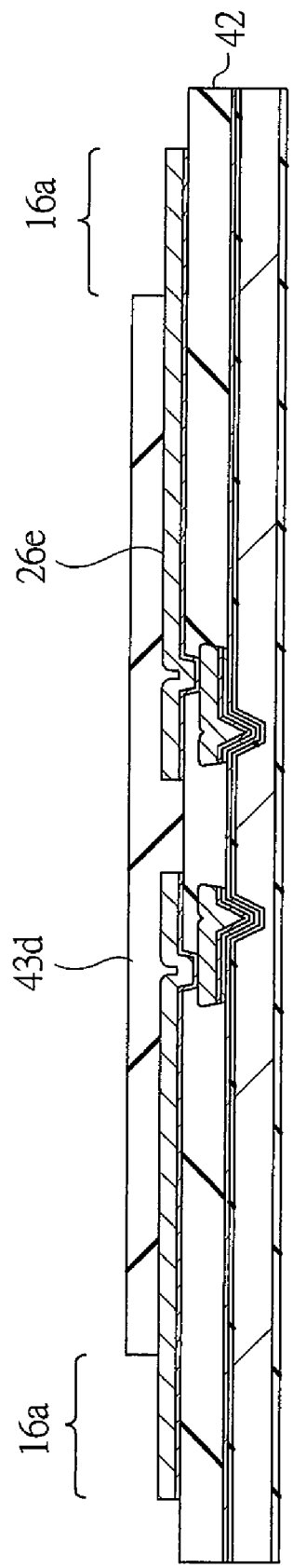

Next, a step shown in FIG. 24B is performed. At the step, after the photoresist mask 49d is removed and the conductive film 48d is removed in a soft etching manner using the wiring material 26e as a mask, a polyimide film 43d is formed in a state that a portion of the peripheral electrode 16a has been exposed so as to cover the wiring material 26e and the polyimide film 42.

Next, a probe sheet structure 25f using the guide pins 7 shown in FIG. 13 is manufactured via steps similar to those explained in the thirteenth embodiment with reference to FIGS. 21A to 21C.

Seventeenth Embodiment

Next, a semiconductor inspecting apparatus using a probe card (a probing apparatus) explained in the first to twelfth embodiments will be explained with reference to FIG. 25.

Figure 25:
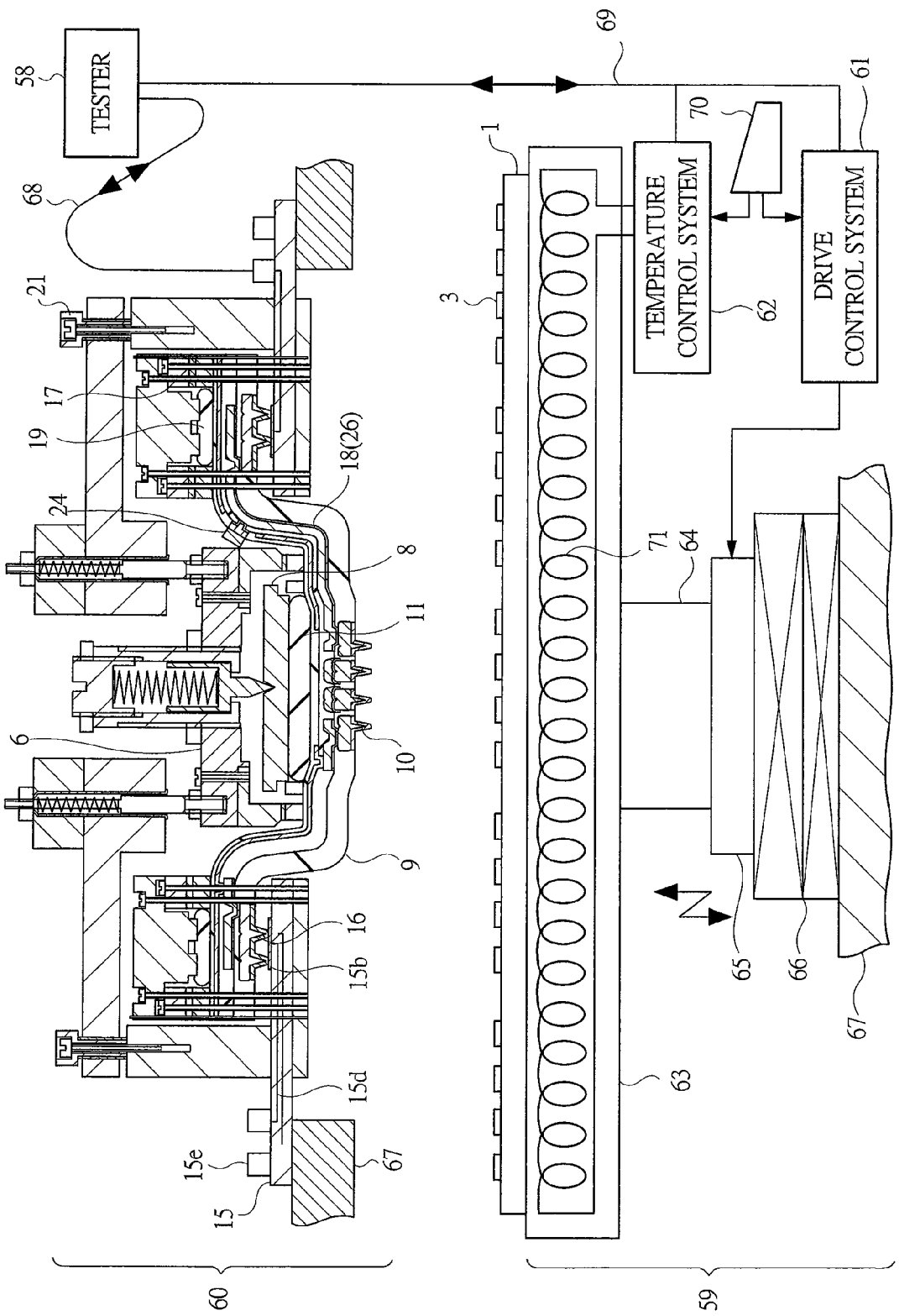
FIG. 25 is a whole schematic configuration view showing one example of an inspecting system according to a seventeenth embodiment of the present invention.

FIG. 25 is a diagram showing a whole schematic configuration of an inspecting system including a semiconductor inspecting apparatus according to a seventeenth embodiment and also showing a testing apparatus performing an electric characteristic inspection by applying desired load to a face of a wafer 1. In this state, pressing force (load) of the guide pins is applied to all the contact terminals 10, and transmission and reception of electric signals for inspection are performed between a tester 58 for performing inspection of electric characteristics of a semiconductor element 2 (whose reference numeral is omitted in FIG. 25) and a semiconductor element 2 produced in the wafer 1 via the contact terminals 10 connected with the electrode 3 of the wafer, the leading wire 18 (wiring material 26), the peripheral electrodes 16, the electrodes 15b of the multi-layered wiring board 15, the internal wires 15d, and the electrodes 15e.

In the whole configuration of the inspecting system, the probe card is configured as a wafer prober. The inspecting system includes a sample supporting system 59 which supports a wafer 1 which is an object to be inspected, a probe card 60 which contacts with electrodes 3 of the object to be inspected (wafer 1) to perform transmission and reception of an electric signal, a drive control system 61 which controls an operation of the sample supporting system 59, a temperature control system 62 which performs temperature control of the object to be inspected (wafer 1), and the tester 58 which performs inspection of electric characteristics of a semiconductor element (chip) 2. The wafer 1 includes many semiconductor elements (chips) 2 arranged thereon and a plurality of electrodes 3 serving as external connection electrodes are arranged on a surface of each semiconductor element 2. The sample supporting system 59 includes a sample stand 63 on which a wafer 1 is attachably/detachably disposed and which is provided horizontally, an elevating shaft 64 which is disposed vertically so as to support the sample stand 63, an elevation drive section 65 which drives elevation of the elevating shaft 64, and an X-Y stage 66 which supports the elevation drive section 65. The X-Y stage 66 is fixed on a casing 67. The elevation drive section 65 comprises, for example, a stepping motor and the like. A positioning behavior of the sample stand 63 in horizontal and vertical directions is performed by a combination of a moving behavior of the X-Y stage 66 within a horizontal plane, a vertical movement conducted by the elevation drive section 65, and the like. The sample stand 63 is provided with a rotating mechanism (not shown) so that rotational displacement of the sample stand 63 within the horizontal plane is made possible.

The probe card 60 is disposed above the sample stand 63. That is, for example, the probe card 60 shown in FIG. 25 is provided to take an attitude facing the corresponding sample stand 63 in parallel. Each of the contact terminals 10 is electrically connected to an electrode 15e provided in the multi-layered wiring board 15 via a leading wire 18 and a peripheral electrode 16 provided on the probe sheet 9 of the probe card 60 through an electrode 15b and an internal wire 15d of the multi-layered wiring board 15, and it is electrically connected to the tester 58 via a cable 68 connected to the electrode 15e.

The drive control system 61 is electrically connected to the tester 58 via a cable 69. The drive control system 61 feeds a control signal to an actuator of each drive unit of the sample supporting system 59 to control an operation of the actuator. That is, the drive control system 61 is provided therein with a computer, and controls an operation of the sample supporting system 59 according to progress information of a test operation of the tester 58 transmitted via the cable 69. The drive control system 61 is also provided with an operation section 70, and it receives inputs of various instructions regarding drive control, for example, an instruction of a manual operation.

The sample stand 63 is provided with a heater 71 for heating a wafer 1 (semiconductor elements 2). The temperature control system 62 controls a temperature of the wafer 1 placed on the sample stand 63 by controlling the heater 71 or a cooling jig of the sample stand 63. The temperature control system 62 is provided with the operation section 70, and it receives inputs of various instructions regarding temperature control, for example, an instruction of a manual operation. Here, temperature control may be performed in a linkage manner between a heat generator whose temperature can be controlled and which is provided at a portion of the probe sheet 9 or the probe card 60 and the heater 71 of the sample stand 63.

An operation of the semiconductor inspecting apparatus will be explained below. First, a wafer 1 which is an object to be inspected is positioned and placed on the sample stand 63, the X-Y stage 66 and a rotating mechanism are drive-controlled and a group of electrodes 3 formed on a plurality of semiconductor elements 2 arranged on the wafer 1 are positioned just below a group of many contact terminals 10 arranged on the probe card 60 in parallel. Thereafter, the drive control system 61 actuates the elevation drive section 65 to elevate the sample stand 63 from a point where whole faces of many electrodes 3 (members to be contacted) contact with distal ends of the contact terminals 10 up to a state that the whole faces have been pushed up by about 10 to 150 μm. Thereby, a region where many contact terminals 10 on the probe sheet 9 are arranged in parallel is protruded, and respective distal ends of many contact terminals 10 in the group whose flatness has been secured at a high accuracy level by performing fine adjustment utilizing the double screws 21 or a shim according to needs are protruded in parallel by a compliance mechanism (pressing mechanism) comprising the plurality of guide pins 7 and the pushing piece 8 so as to follow whole faces of many electrodes 3 in the group (whole) arranged on the semiconductor elements 2. Thereby, contact depending on pushing-in based upon even low load (about 3 to 150 mN per one pin) along respective contact members (electrodes 3) arranged on the wafer 1 is performed so that electric connection is performed with a low resistance (0.01 to $0.1\Omega$) between the respective contact terminal 10 and the respective electrode 3.

In this case, the pushing piece 8 is protruded in parallel by the protrusion portion 4a of the spring plunger 4 (see FIG. 2) at a pressing time such that a face of the probe sheet within the frame 5 (see FIG. 2) follows a face of the group of the electrodes 3 of the semiconductor elements 2, and the face of the probe sheet within the frame 5 bonded to the frame 5 is protruded in parallel by the plurality of guide pins 7 so as to follow the face of the group of the electrodes 3 of the semiconductor elements 2 so that contact due to pushing-in is performed.

When the semiconductor element 2 is a SoC (System on Chip) formed with a semiconductor integrated circuit having a plurality of functions, means for arranging wires and elements below the electrodes 3 is adopted in order to realize two objects of producing a semiconductor circuit with a plurality of functions in one semiconductor element 2 and responding to a demand for size reduction of the semiconductor element 2. When the semiconductor element 2 is the SoC and it is used for high-speed electric signal, material with dielectric constant further lower than that of silicon oxide ($SiO_2$) is used as an insulating film between wiring layers in order to make thin and fine wires while reducing dielectric loss. Since such a material with low dielectric constant is relatively weak in withstand load and mechanical strength, a semiconductor inspecting apparatus which can realize a stable contact resistance at a low load of about several tens mN or less so as not to damage not only low dielectric material configuring the insulating layer between wiring layers but also wires and elements disposed below the electrodes 3 is desired.

As described above, according to the semiconductor inspecting apparatus according to the seventeenth embodiment, contact due to pushing-in based upon even low load according to respective members to be contacted (electrodes 3) arranged on the wafer 1 is performed and respective contact terminal 10 and respective electrode 3 are electrically connected with low resistances therebetween. Therefore, low dielectric material serving as an insulating film between wiring layers and wires and elements disposed below the electrodes 3 can be prevented from being damaged at a contact time between the contact terminals 10 and the electrodes 3.

In the semiconductor element 2 which is the SoC, since electrodes 3 can be disposed on wires and elements, positions on which the electrodes 3 should be disposed can be freely selected from not only positions along an outer periphery of the semiconductor element 2 but also positions within a plane of the semiconductor element 2. Thereby, since flexibility of layout design of elements, wires and electrodes 3 within the semiconductor element 2 can be increased, for example, a wire length from an input/output buffer circuit or the like to electrodes 3 can be reduced by forming the electrodes 3 just above the input/output buffer circuit or the like formed within a semiconductor element 2, so that an operation speed of the input/output buffer circuit or the like can be improved.

Further, transmission and reception of an operation current and an operation inspection signal are performed between a semiconductor element 2 formed on the wafer 1 and the tester 58 via the cable 68, the wiring board 15, and contact terminals 10 so that evaluation of operation characteristics of the semiconductor element 2 is made. A series of inspection operations explained above are performed for each of a plurality of semiconductor elements formed on a wafer 1 so that evaluation of operation characteristics is performed for each semiconductor element.

Eighteenth Embodiment

Figure 26:
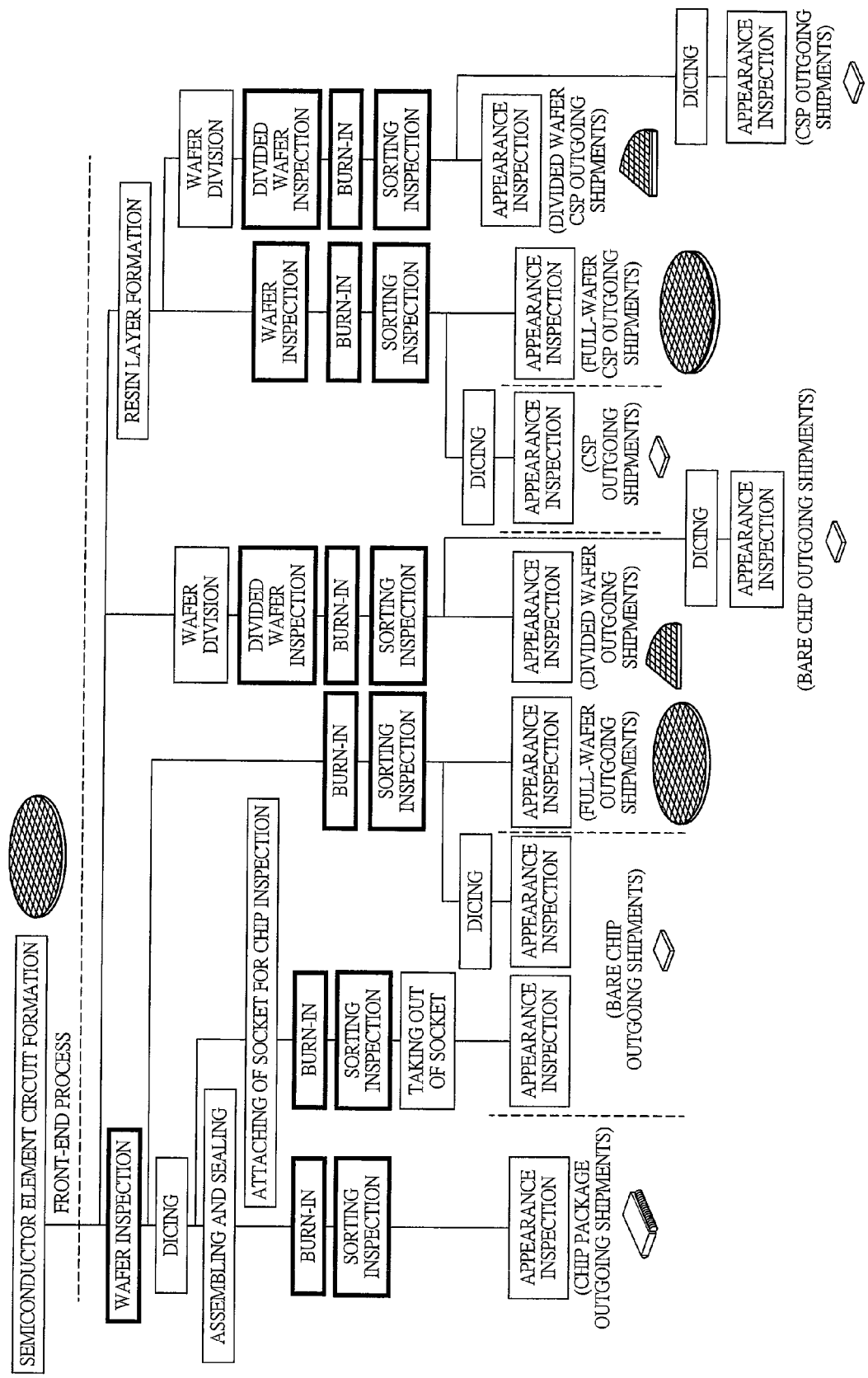
FIG. 26 is a step diagram showing one example of an inspecting step for a semiconductor device.
Figure 27:
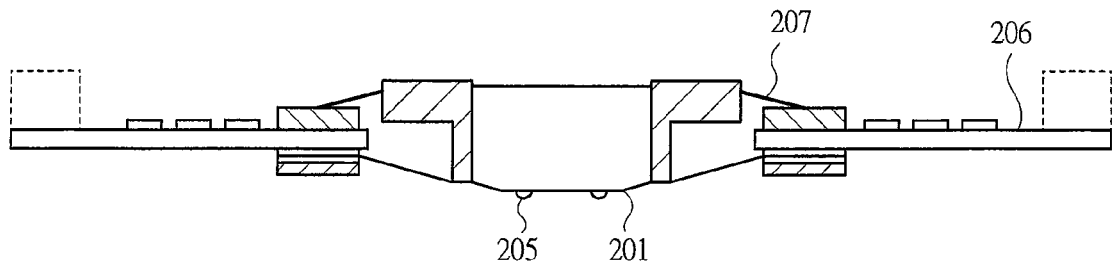
FIG. 27 is a sectional view of a main portion of a conventional semiconductor element inspecting apparatus using bumps obtained by plating.
Figure 28:
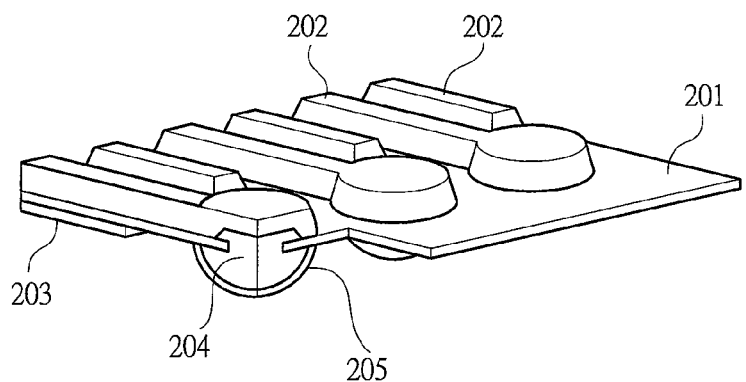
FIG. 28 is a perspective view showing a bump portion obtained by plating shown in FIG. 27.
Figure 29:
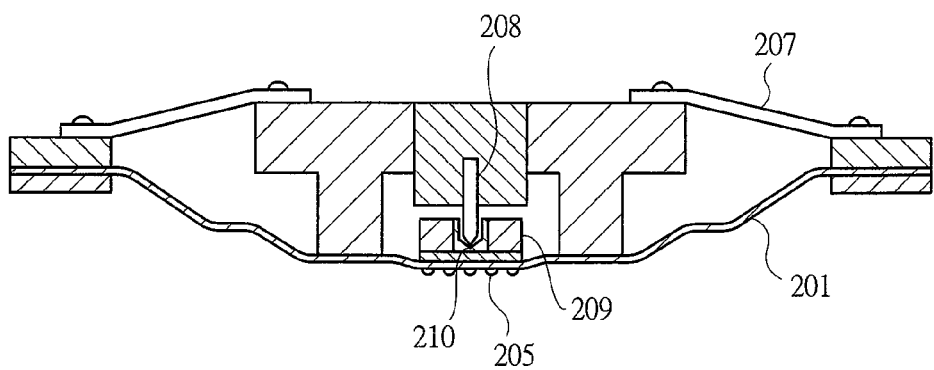
FIG. 29 is a sectional view of a main portion of a conventional semiconductor element inspecting apparatus using bumps obtained by plating.
Figure 30:
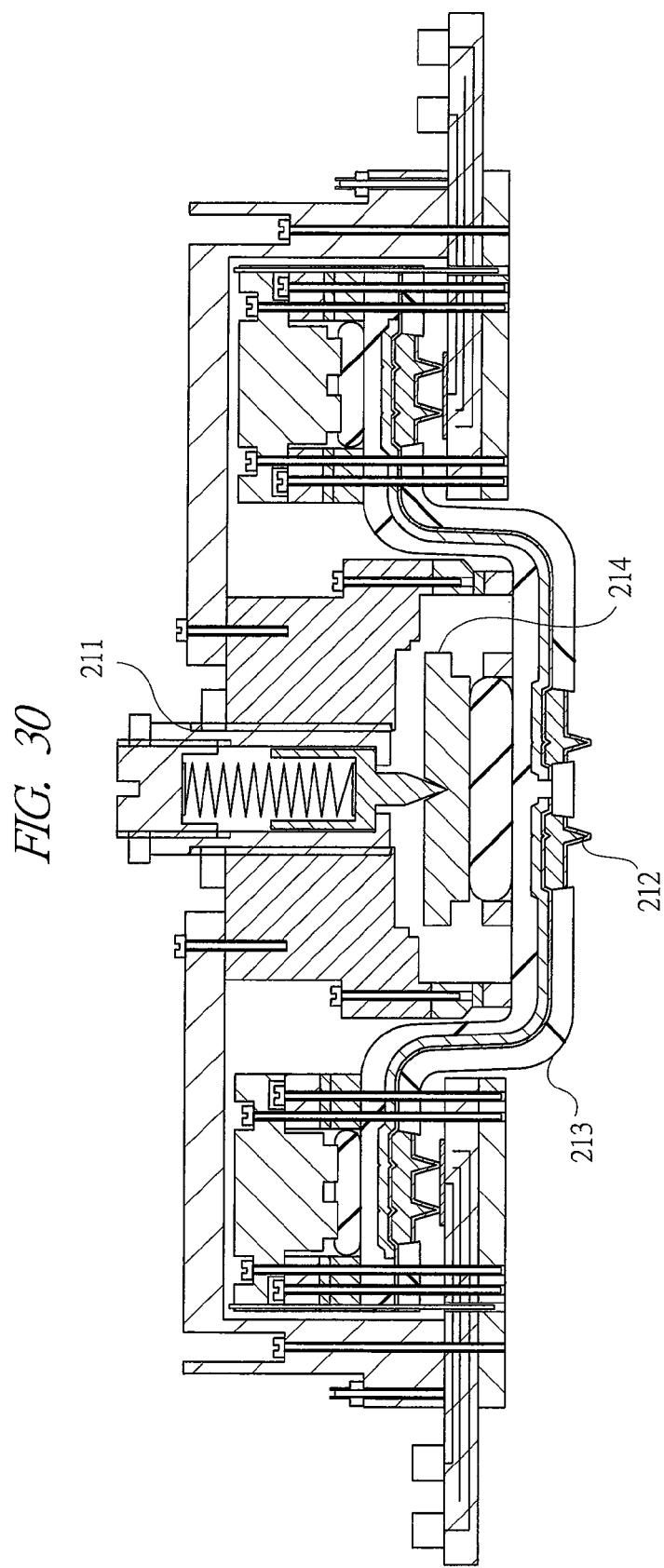
FIG. 30 is a sectional view of a main portion of a semiconductor element inspecting apparatus using a conventional probe sheet formed with four-sided pyramid-shaped contact terminals.

Here, representative examples of a manufacturing method of a semiconductor device including an inspecting step or an inspecting method, using the semiconductor inspecting apparatus explained in the seventeenth embodiment will be explained with reference to FIG. 26.

(1) The manufacturing method of a semiconductor device according to the eighteenth embodiment includes a step of producing circuits in a wafer I to form semiconductor elements (semiconductor element circuit formation), a step of collectively inspecting electric characteristics of a plurality of semiconductor devices in a wafer level by a semiconductor inspecting apparatus (wafer inspection), a step of dicing the wafer to separate the same to individual semiconductor elements 2 (dicing), and a step of sealing the respective semiconductor elements 2 using resin or the like (assembling and sealing). Thereafter, respective semiconductor elements 2 are shipped as chip package products via burn-in, sorting inspection, and appearance inspection.

(2) The manufacturing method of a semiconductor device according to the eighteenth embodiment includes a step of producing circuits in a wafer 1 to form semiconductor elements 2 (semiconductor element circuit formation), a step of collectively inspecting electric characteristics of a plurality of semiconductor elements 2 in a wafer level by a semiconductor inspecting apparatus (wafer inspection), and a step of dicing the wafer 1 to separate the same to individual semiconductor elements 2 (dicing). Thereafter, respective semiconductor elements 2 are shipped as bare chip outgoing shipments via attaching of sockets for chip inspection, burn-in, sorting inspection, detaching from the sockets, and appearance inspection.

(3) The manufacturing method of a semiconductor device according to the eighteenth embodiment includes a step of producing circuits in a wafer 1 to form semiconductor devices (semiconductor element circuit formation), and a step of collectively inspecting electric characteristics of a plurality of semiconductor devices in a wafer level by a semiconductor inspecting apparatus (wafer inspection). Thereafter, respective semiconductor devices are shipped as full wafer outgoing shipments via burn-in, sorting inspection, and appearance inspection. Even in the burn-in and the sorting inspection, inspections are performed by the semiconductor inspecting apparatus according to the seventeenth embodiment.

(4) The manufacturing method of a semiconductor device according to the eighteenth embodiment includes a step of producing circuits in a wafer 1 to form semiconductor devices (semiconductor element circuit formation), and a step of collectively inspecting electric characteristics of a plurality of semiconductor devices in a wafer level by a semiconductor inspecting apparatus (wafer inspection). Thereafter, respective semiconductor devices are shipped as bare chip outgoing shipments via a step of dicing the wafer 1 to separate the same to individual semiconductor elements 2 (dicing) and appearance inspection via burn-in and sorting inspection. Even in the burn-in and the sorting inspection, inspections are performed by the semiconductor inspecting apparatus according to the seventeenth embodiment.

(5) The manufacturing method of a semiconductor device according to the eighteenth embodiment includes a step of producing circuits in a wafer 1 to form semiconductor devices (semiconductor element circuit formation), a step of dividing the wafer 1 (wafer division), and a step of collectively inspecting electric characteristics of a plurality of semiconductor devices in a divided wafer level by a semiconductor inspecting apparatus (divided wafer inspection). Thereafter, respective semiconductor elements 2 are shipped as divided wafer outgoing shipments via burn-in, sorting inspection, and appearance inspection. Even in the burn-in and the sorting inspection, inspections are performed by the semiconductor inspecting apparatus according to the seventeenth embodiment.

(6) The manufacturing method of a semiconductor device according to the eighteenth embodiment includes a step of producing circuits in a wafer 1 to form semiconductor devices (semiconductor element circuit formation), a step of dividing the wafer 1 (wafer division), and a step of collectively inspecting electric characteristics of a plurality of semiconductor devices in a divided wafer level by a semiconductor inspecting apparatus (divided wafer inspection). Thereafter, respective semiconductor devices are shipped as bare chip outgoing shipments via burn-in, sorting inspection, a step of dicing the divided wafers to separate the same to individual semiconductor elements 2 (dicing), and appearance inspection. Even in the burn-in and the sorting inspection, inspections are performed by the semiconductor inspecting apparatus according to the seventeenth embodiment.

(7) The manufacturing method of a semiconductor device according to the eighteenth embodiment includes a step of producing circuits in a wafer 1 to form semiconductor devices (semiconductor element circuit formation), a step of forming a resin layer or the like on the wafer 1 (resin layer formation), and a step of collectively inspecting electric characteristics of a plurality of semiconductor elements formed on the wafer formed with the resin layer or the like by a semiconductor inspecting apparatus (wafer inspection). Thereafter, via a step of dicing the wafer 1 to separate the same to individual semiconductor elements 2 (dicing) via burn-in and sorting inspection, and appearance inspection, respective semiconductor elements 2 are shipped as CSP outgoing shipments. Even in the burn-in and the sorting inspection, inspections are performed by the semiconductor inspecting apparatus according to the seventeenth embodiment.

(8) The manufacturing method of a semiconductor device according to the eighteenth embodiment includes a step of producing circuits in a wafer 1 to form semiconductor devices (semiconductor element circuit formation), a step of forming a resin layer or the like on the wafer 1 (resin layer formation), and a step of collectively inspecting electric characteristics of a plurality of semiconductor elements formed on the wafer formed with the resin layer or the like by a semiconductor inspecting apparatus (wafer inspection). Thereafter, respective semiconductor elements 2 are shipped as full wafer CSP outgoing shipments via burn-in, sorting inspection, and appearance inspection. Even in the burn-in and the sorting inspection, inspections are performed by the semiconductor inspecting apparatus according to the seventeenth embodiment.

(9) The manufacturing method of a semiconductor device according to the eighteenth embodiment includes a step of producing circuits in a wafer 1 to form semiconductor devices (semiconductor element circuit formation), a step of forming a resin layer or the like on the wafer 1 (resin layer formation), a step of dividing the wafer 1 formed with the resin layer or the like (wafer division), and a step of collectively inspecting electric characteristics of a plurality of semiconductor device in divided wafer level by a semiconductor inspecting apparatus (divided wafer inspection). Thereafter, respective semiconductor elements 2 are shipped as divided wafer CSP outgoing shipments via burn-in, sorting inspection, and appearance inspection. Even in the burn-in and the sorting inspection, inspections are performed by the semiconductor inspecting apparatus according to the seventeenth embodiment.

(10) The manufacturing method of a semiconductor device according to the eighteenth embodiment includes a step of producing circuits in a wafer 1 to form semiconductor devices (semiconductor element circuit formation), a step of forming a resin layer or the like on the wafer 1 (resin layer formation), a step of dividing the wafer 1 formed with the resin layer or the like (wafer division), and a step of collectively inspecting electric characteristics of a plurality of semiconductor device in divided wafer level by a semiconductor inspecting apparatus (divided wafer inspection). Thereafter, via burn-in, sorting inspection, a step of dicing the wafer to separate the same into individual semiconductor elements 2 (dicing), and appearance inspection, respective semiconductor elements 2 are shipped as CSP outgoing shipments. Even in the burn-in and the sorting inspection, inspections are performed by the semiconductor inspecting apparatus according to the seventeenth embodiment.

At the step of inspecting electrical characteristics of semiconductor elements in the manufacturing method of a semiconductor device described above, inspection with stable contact resistance value and excellent signal transmission characteristics can be realized, where high distal end position accuracies of the contact terminals 10 are obtained with lower load pressing force of several tens mN or less by using the probe sheet structure according to each of the first to twelfth embodiments.

That is, in the probe card explained in each embodiment, the frame is fixed to the probe sheet collectively formed with contact terminals with excellent positional accuracy having pyramid-shape or truncated pyramid-shape, leading wires, and peripheral electrodes so as to surround a region where the contact terminals have been formed, the probe sheet can be protruded slightly from the frame by the pushing piece and it can be finely tilted, pressing force can be imparted to the contact terminals via the frame and the pushing piece in a state that the probe sheet can be slightly tilted by a plurality of guide pins having spring property. Thereby, even in a probe sheet formed with contact terminals of multi-pins with narrow pitch of several tens µm or less, a contact terminal group which can be brought in contact with a corresponding electrode group of a semiconductor element easily with a low load can be collectively formed, and design of electric signal characteristics due to multi-layer of wires is easy, so that a probe card for semiconductor inspection of a multi-pin with a narrow-pitch which has a circuit for high-speed transmission with impedance matching and assembly easiness can be realized.

According to the probe card explained in of the above embodiments, a probe sheet collectively formed with pyramid-shaped or truncated pyramid-shaped contact terminals is formed integrally with an assembling base material, and both pressing action and finely tilting action are achieved by guide pins. Thereby, a probe card excellent in stability of contact resistance values and excellent in positional accuracy and assembling easiness of a contact terminal group can be realized.

Though the invention which has been made by the inventors has been specifically explained above based upon the embodiments, it is not limited to the embodiments and it may be variously modified without departing from the gist of the present invention, of course.

For example, in the above embodiments, the example where the probe sheet structure having the structure shown in FIG. 2 is combined to the probe sheet manufactured at the steps explained with reference to FIGS. 20A to 21C for use has been shown, but, for example, a probe sheet obtained at manufacturing steps such as shown in FIGS. 23A and 23B or FIGS. 24A and 24B and a probe sheet structure such as shown in FIG. 11 or FIGS. 13 to 19 may freely be combined to be used, of course.

As described above, the present invention can achieve such an effect that it can be widely applied to a probe card, a semiconductor inspecting apparatus, and a manufacturing method of a semiconductor device.

The effects obtained by typical aspects of the present invention will be briefly described below.

A probe card of the present invention is provided with a probe sheet collectively formed with pyramid-shaped or truncated pyramid-shaped contact terminals excellent in positional accuracy, leading wires, and peripheral electrodes, a frame is fixed to the probe sheet so as to surround a region where the contact terminals have been formed, a pressing force is imparted to the frame by a plurality of guide pins having spring property so that the contact terminals are protruded from a multi-layered wiring board, and the frame and a pushing piece at a central portion thereof can be finely tilted. Therefore, the probe card of the present invention has the following effects as compared with a membrane probe formed with hemispherical plated bumps or a membrane probe using a pressurizing mechanism provided with a spring plunger disposed only at a central portion of a probe sheet.

(1) Even in a probe sheet formed with contact terminals of multi-pin with narrow pitch of several tens μm and multi-pins, a contact terminal group which can be brought in contact with a corresponding electrode group of a semiconductor element easily with a low load can be collectively formed, and design of electric signal characteristics due to multi-layer of wires is easy, so that a probe card having a circuit for high-speed transmission with impedance matching can be realized.

(2) According to a configuration where, simultaneously with positioning of a probe sheet performed by a plurality of guide pins having spring property and a plurality of positioning-dedicated guide pins, a pressing force is imparted or provided, a probe card for semiconductor inspection of multi-pin with a narrow pitch where pressing load is controlled over a wide range can be realized.

(3) A probe sheet collectively formed with pyramid-shaped or truncated pyramid-shaped contact terminals is formed integrally with an assembling base material, and both pressing action and finely tilting action are achieved by guide pins, so that a probe card excellent in stability of contact resistance values even under a low load and excellent in positional accuracy and assembling easiness of a contact terminal group can be realized.

The present invention may be embodied in other specific forms without departing from the spirit or essential characteristics thereof. The present embodiment is therefore to be considered in all aspects as illustrated and not restrictive. The scope of the present invention being indicated by the appended claims rather than by the foregoing description and all changes which come within the meaning and range of equivalency of the claims are therefore intended to be embraced therein.

What is claimed is:

1. A probe card comprising a probe sheet, the probe sheet including:
   a main surface;
   a rear surface located on a reverse side of the main surface;
   a plurality of contact terminals provided on a main surface side so as to contact with electrodes provided on an object to be inspected;
   wires drawn from the contact terminals; and
   a plurality of peripheral electrodes electrically connected to the wires and connected to electrodes of a multi-layered wiring board,
   the probe card further comprising:
   a frame formed so as to surround the plurality of contract terminals;
   a first pressing portion for providing a pressing force from a rear surface side of the probe sheet via a pressing piece to a region in which the plurality of contact terminals of the probe sheet are formed;
   a second pressing portion for providing a pressing force to the rear surface side of the probe sheet via the frame; and
   a connecting portion which connects the first and second pressing portions,
   wherein the connecting portion and the pressing piece are not in contact with each other.

2. The probe card according to claim 1, further comprising means for allowing tilting of a region where the plurality of contact terminals are formed within a region where the frame is formed.

3. The probe card according to claim 1, wherein the plurality of contact terminals are pyramid-shaped or truncated pyramid-shaped,
the electrodes of the multi-layered wiring board are provided with a pressing plate for contacting with the peripheral electrodes of the probe sheet in a pressurizing manner, and
the probe sheet is held so as to protrude from the multi-layered wiring board.

4. The probe card according to claim 1, wherein the second pressing portion is disposed such that the region where the frame is formed and the region where the plurality of contact terminals are formed can be tilted.

5. The probe card according to claim 1, wherein the probe sheet has at least one of a ground wiring layer and a power source wiring layer electrically connected to the wires, and
the wires connected to the ground wiring layer and the power source wiring layer are formed to have a width larger than that of a wire which is not connected to either of the ground wiring layer and the power source wiring layer.

6. The probe card according to claim 1, further comprising wherein the region to which the pressing force is provided from the rear surface side of the probe sheet by the first pressing portion is disposed at a central portion of the probe sheet.

7. The probe card according to claim 1, wherein the second pressing portion is a plurality of guide pins having spring property.

8. The probe card according to claim 1, wherein the second pressing portion includes a plurality of guide pins having spring property and a plurality of guide pins without spring property.

9. The probe card according to claim 1, wherein the plurality of contact terminals are formed by plating utilizing holes formed by etching a substrate having crystalline in an anisotropic manner as mold material.

10. The probe card according to claim 1, wherein the object to be inspected includes an insulating film with dielectric constant lower than that of $SiO_2$ as an insulating film between wiring layers.

11. The probe card according to claim 1, wherein the second pressing portion is plural in number and they are disposed so as to surround the first pressing portion.

12. The probe card according to claim 1, wherein the plurality of contact terminals are disposed below the multi-layered wiring board, and
the wire of the probe sheet is connected to the electrode of the multi-layered wiring board on an upper surface side of the multi-layered wiring board.

13. The probe card according to claim 1, wherein a supporting member fixed to the multi-layered wiring board is disposed outside the frame.

14. A semiconductor inspecting apparatus comprising:
a sample stand on which an object to be inspected is placed; and
a probe card which has a plurality of contact terminals contacting with electrodes provided on the object to be inspected and is electrically connected to a tester inspecting electric characteristics of the object to be inspected, wherein
the probe card comprises a probe sheet, the probe sheet including:
a main surface;
a rear surface located on a reverse side of the main surface;
a plurality of contact terminals provided on a main surface side so as to contact with electrodes provided on the object to be inspected;

wires drawn from each of the contact terminals; and a plurality of peripheral electrodes electrically connected to the wires and electrodes of a multi-layered wiring board, the probe card further comprising:

a frame formed so as to surround the plurality of contact terminals;

a first pressing portion for providing a pressing force from a rear surface side of the probe sheet via a pressing piece to a region in which the plurality of contact terminals of the probe sheet are formed;

a second pressing portion for providing a pressing force to the rear surface side of the probe sheet via the frame; and a connecting portion which connects the first and second pressing portions, and the connecting portion and the pressing piece are not in contact with each other.

15. The semiconductor inspecting apparatus according to claim 14, wherein means for allowing tilting of a region where the plurality of contact terminals are formed within a region where the frame is formed is provided on the probe card.

16. The semiconductor inspecting apparatus according to claim 14, wherein the plurality of contact terminals are pyramid-shaped or truncated pyramid-shaped, the electrodes of the multi-layered wiring board are provided with a pressing plate for contacting with the plurality of peripheral electrodes of the probe sheet in a pressurizing manner, and the probe sheet is held so as to protrude from the multi-layered wiring board.

17. The semiconductor inspecting apparatus according to claim 14, wherein the second pressing portion is disposed such that the region where the frame is formed and the region where the plurality of contact terminals are formed can be tilted.

18. The semiconductor inspecting apparatus according to claims 14, wherein the object to be inspected includes an insulating film with dielectric constant lower than that of $SiO_2$ as an insulating film between wiring layers.

* * * * *